(12) United States Patent  (10) Patent No.: US 7,868,543 B2
Kobayashi  (45) Date of Patent: Jan. 11, 2011

(54) LIGHT-EMITTING DEVICE HAVING OPENINGS IN ELECTRODE

(75) Inventor: Hidekazu Kobayashi, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 284 days.

(21) Appl. No.: 12/230,148

(22) Filed: Aug. 25, 2008

(65) Prior Publication Data

US 2008/0315761 A1 Dec. 25, 2008

Related U.S. Application Data

(63) Continuation of application No. 10/972,348, filed on Oct. 26, 2004, now Pat. No. 7,449,833.

(30) Foreign Application Priority Data

| Nov. 7, 2003 | (JP) | ............................. 2003-378364 |
| Dec. 26, 2003 | (JP) | ............................. 2003-432402 |
| Sep. 8, 2004 | (JP) | ............................. 2004-260547 |

(51) Int. Cl.
*H01J 1/62* (2006.01)

(52) U.S. Cl. ...................... 313/506; 313/503

(58) Field of Classification Search .......... 313/498–512
See application file for complete search history.

(56) References Cited

U.S. PATENT DOCUMENTS

| 4,356,429 A | 10/1982 | Tang |
| 6,046,543 A | 4/2000 | Bulovic et al. |
| 6,091,384 A | 7/2000 | Kubota et al. |
| 6,341,994 B1 | 1/2002 | Ootsuki et al. |
| 6,396,208 B1 | 5/2002 | Oda et al. |
| 6,433,487 B1 | 8/2002 | Yamazaki |
| 6,522,315 B2 | 2/2003 | Ozawa et al. |
| 6,630,784 B2 | 10/2003 | Yoneda |
| 6,650,045 B1 | 11/2003 | Forrest et al. |
| 6,706,425 B2 | 3/2004 | Ishii et al. |
| 6,765,549 B1 | 7/2004 | Yamazaki et al. |
| 6,781,152 B2 | 8/2004 | Yamazaki |
| 6,844,672 B2 | 1/2005 | Yamazaki |
| 6,882,102 B2 | 4/2005 | Yamazaki |
| 6,888,520 B2 | 5/2005 | Ouchi et al. |
| 6,894,432 B2 | 5/2005 | Fujieda et al. |
| 6,951,495 B2 | 10/2005 | Yoneda |
| 6,958,490 B2 | 10/2005 | Okamoto et al. |

(Continued)

FOREIGN PATENT DOCUMENTS

CN    1427651 A    7/2003

(Continued)

*Primary Examiner*—Bumsuk Won
(74) *Attorney, Agent, or Firm*—Oliff & Berridge, PLC

(57) ABSTRACT

The invention provides a light-emitting device, a manufacturing method thereof, and an electronic apparatus which can improve the emission efficiency of light, obtain uniform brightness within a display surface in high reliability, in particular, and which can suppress lowering of the emission efficiency of light due to various wiring line structures, even though a large screen is performed. In a light-emitting device having a light-emitting element in which a first electrode on a base substrate, a functional layer having a light-emitting layer, and a second electrode are sequentially deposited, the first electrode and the second electrode are reflective, and the second electrode has an opening through which light from the light-emitting layer passes.

3 Claims, 9 Drawing Sheets

U.S. PATENT DOCUMENTS

| | | |
|---|---|---|
| 7,291,970 B2 | 11/2007 | Kuwabara |
| 2003/0015961 A1* | 1/2003 | Yamazaki ............... 313/504 |
| 2003/0201716 A1* | 10/2003 | Yamazaki et al. ......... 313/506 |
| 2003/0230972 A1 | 12/2003 | Cok |
| 2004/0017162 A1 | 1/2004 | Sato et al. |
| 2005/0058852 A1 | 3/2005 | Tyan et al. |
| 2005/0190130 A1 | 9/2005 | Ouchi et al. |

FOREIGN PATENT DOCUMENTS

| | | |
|---|---|---|
| JP | A-57-51781 | 3/1982 |
| JP | A-59-194393 | 11/1984 |
| JP | A-63-70257 | 3/1988 |
| JP | A-63-175860 | 7/1988 |
| JP | A-2-135359 | 5/1990 |
| JP | A-2-135361 | 5/1990 |
| JP | A-2-209988 | 8/1990 |
| JP | A-3-37992 | 2/1991 |
| JP | A-3-152184 | 6/1991 |
| JP | A 10-189251 | 7/1998 |
| JP | A 11-214163 | 8/1999 |
| JP | A-11-251069 | 9/1999 |
| JP | A-11-265791 | 9/1999 |
| JP | A-11-265794 | 9/1999 |
| JP | A 2000-208255 | 7/2000 |
| JP | A 2000-268980 | 9/2000 |
| JP | A-2000-315582 | 11/2000 |
| JP | A-2001-035653 | 2/2001 |
| JP | A 2001-143874 | 5/2001 |
| JP | A 2001-507503 | 6/2001 |
| JP | A-2001-217078 | 8/2001 |
| JP | A 2001-222256 | 8/2001 |
| JP | A 2001-290439 | 10/2001 |
| JP | A-2001-319789 | 11/2001 |
| JP | A 2002-170688 | 6/2002 |
| JP | A-2002-202737 | 7/2002 |
| JP | A 2003-092191 | 3/2003 |
| JP | A-2003-151770 | 5/2003 |
| JP | A-2003-173875 | 6/2003 |
| JP | A-2003-208109 | 7/2003 |
| JP | A 2003-243182 | 8/2003 |
| JP | A 2003-303677 | 10/2003 |
| JP | A-2003-317971 | 11/2003 |
| JP | A-2004-127933 | 4/2004 |
| JP | A 2004-214010 | 7/2004 |
| JP | A 2005-326757 | 11/2005 |
| WO | WO 98/36407 | 8/1998 |

* cited by examiner

LIGHT-EMITTING DEVICE HAVING OPENINGS IN ELECTRODE

This is a Continuation of application Ser. No. 10/972,348 filed Oct. 26, 2004. The disclosure of the prior application is hereby incorporated by reference herein in its entirety.

BACKGROUND OF THE INVENTION

1. Field of Invention

The present invention relates to a light-emitting device, such as a liquid crystal device, an organic EL (electroluminescent) device or an inorganic EL device, a manufacturing method of the light-emitting device, and an electronic apparatus in which the light-emitting device is mounted.

2. Description of Related Art

Conventionally, in light-emitting devices such as organic electroluminescent (hereinafter, referred to as organic EL) devices, a plurality of circuit elements, an anode, a hole injection layer, a light-emitting layer made of an electro-optical material such as an EL material, a cathode and so on are deposited on a substrate, and then a sealing substrate is provided, with these elements interposed between the substrates. More specifically, an anode made of a transparent conductive material such as indium tin oxide (ITO) or tin oxide ($SnO_2$), a hole injecting layer made of a dopant such as polythiophene derivative (hereinafter, referred to as PEDOT), a light-emitting layer made of a light-emitting material such as polyfluorene, and a cathode made of a metallic material having a low work function such as Ca or a metallic compound are sequentially deposited on a transparent substrate such as a glass substrate.

In such an organic EL device, holes injected from the anode side and electrons injected from the cathode side are recombined in the fluorescent light-emitting layer, and when the recombined holes and electrons relax from an excited state, light emission is caused.

Further, as a structure in which the light is emitted to a viewer side, for example, a so-called bottom-emission-type structure is known, in which the emitted light is emitted from the substrate side on which the circuit elements are formed (for example, see U.S. Pat. No. 4,356,429). Further, in recent years, demands for large organic EL devices having high definition and high brightness are increasing, and thus, top-emission-type organic EL devices, which are suitable for realizing light-emitting elements having high aperture ratio and high efficiency, are being studied and developed (for example, see International Publication Pamphlet No. WO98/36407).

In the top-emission-type organic EL device, an upper electrode in the light-emitting side is needed to be transparent, and in the construction described in U.S. Pat. No. 4,356,429, the upper electrode is comprised of an ITO (indium tin oxide) film or a thin laminate of an Al film and an ITO film. However, when such the construction is adopted, a transparent conductive film, typified by an ITO film, has high resistance as compared with a metallic film, typified by an Al film, and thus brightness irregularity of the light-emitting element is caused by a voltage drop due to the resistance of the transparent conductive film itself.

Further, if the upper electrode is formed with a metallic film such as Al, there is a problem in that sufficient transmittance is not obtained and the light emission efficiency is lowered.

Further, in almost all top-emission-type structures, the electrode is transparent, and thus sufficient transmittance is not obtained, or, even though transmittance is obtained, the reliability is poor. Further, in a conventional organic EL device, since the light emitted from the light-emitting layer is emitted directly outside, there is a problem in that light of not more than 20 percent is emitted.

Further, if the transparent conductive material made of a metallic oxide such as ITO is deposited on the electron injecting layer having a low work function including an alkali metallic material such as Li or Na or an alkali earth metallic material such as Be, Mg or Ca, the electron injecting layer may be damaged.

Meanwhile, in the bottom-emission-type organic EL device, since various wiring lines are arranged at positions which block emitted light, there is a problem in that the emission efficiency of light is lowered due to the wiring lines.

SUMMARY OF THE INVENTION

The present invention is made in consideration of the above problems, and it is an object of the present invention to provide a light-emitting device which is capable of improving the emission efficiency of light, obtaining uniform brightness in a display surface with high reliability, and, even in the case of a large device, preventing the emission efficiency of light from being lowered due to various wiring line structures. Further, it is another object of the present invention to provide a manufacturing method of the light-emitting device, and an electronic apparatus.

In order to attain the above objects, there is provided a light-emitting device comprising a light-emitting element in which a first electrode, a functional layer having a light-emitting layer and a second electrode are sequentially deposited on a substrate, in which the first electrode and the second electrode are reflective, and the second electrode has an opening for transmitting light from the light-emitting layer.

In the present invention, the light-emitting device generally includes a device in which electrical energy is converted into optical energy to generate optical phenomenon.

Further, in the present invention, the opening refers to a region through which light from the light-emitting layer passes, a region in which the electrode is not formed, or a hole portion formed in the electrode. Further, in the case in which an electrode having transparency and an electrode having opacity are deposited, a hole portion is formed in the electrode having opacity, through which light passes via the electrode having transparency, and thus the hole portion may be referred to as the opening.

According to the present invention, electrical power is supplied to the functional layer interposed between the first electrode and the second electrode, and then light is generated in the light-emitting layer. Subsequently, light is reflected between the first electrode and the second electrode, and reflected light propagates in a surface direction of the functional layer. Therefore, it is possible to emit light outside the functional layer via the opening of the second electrode.

Further, in the present invention, in the case in which the second electrode is not made of a transparent conductive material such as a metallic oxide, it is possible to use a material having a low work function including an alkali metallic material such as Li or Na, or an alkali earth metallic material such as Be, Mg or Ca as the electron injecting layer. Thus, it is possible to allow electrons to be injected into the light-emitting layer, and further it is possible to advance brightness of light from the light-emitting element.

Further, in the light-emitting device, since the light generated by the light-emitting layer is emitted without transmitting the transparent conductive film, the light is emitted with high efficiency without being attenuated almost, and thus it is possible to realize bright display.

In addition, in the present invention, since the second electrode may be made of a metallic film being reflective, high reliability and low resistance, it is possible to reduce brightness irregularity of the light-emitting element which is caused by voltage drop due to the resistance of the second electrode itself. Further, as compared with the conventional light-emitting device in which the electrode is made of a transparent conductive material, it is possible to obtain the high reliability.

In the light-emitting device of the present invention, the first electrode may have an inclined surface portion inclined with respect to a surface of a base substrate, in a non-forming region of the second electrode.

According to this construction, in a region in which the second electrode is not formed, that is, a region at which light propagating inside the functional layer is emitted outside, much light is emitted to the front side of the light-emitting device (in an approximately normal direction of the base substrate).

That is, it is possible to provide the light-emitting device which can display with high brightness in a viewer direction. Further, an inclined angle of the inclined surface portion is preferably about 45° to the surface of the base substrate. According to this construction, it is possible to emit the light, which propagates inside the functional layer and is reflected by the inclined surface portion, in the normal direction of the base substrate. Thus, it is possible to obtain brightest display at the front side of the light-emitting device.

The light-emitting device of the present invention may further comprise a partition surrounding the light-emitting element, and the first electrode may extend to an inner wall surface of the partition.

According to this invention, the first electrode extending to the inner wall surface of the partition is arranged to be erected from an electrode surface in the inner wall surface. Thus, since light propagating inside the functional layer is reflected in the erected portion of the first electrode, light is outputted with high directivity toward the front side of the light-emitting device. Therefore, it is possible to display with high brightness in the viewer direction.

The light-emitting device of the present invention may further comprise an inner partition for dividing the region surrounded by the partition in plan view, and the first electrode may extend to an inner wall surface of the inner partition.

In the light-emitting device according to the present invention, light generated in a region in which the first electrode and the second electrode oppose each other propagates in a surface direction of the functional layer and is emitted outside in the non-forming region of the second electrode. For this reason, if a propagation distance inside the functional layer becomes long, though it is few, the amount of attenuation becomes much, and thus efficiency tends to be lowered. Therefore, like the present invention, by dividing the light-emitting element with the inner partition, it is possible to decrease an opposing area of both electrodes (light-emitting area), and it is possible to suppress the amount of attenuation inside the functional layer. Further, since the first electrode is formed up to the inner wall surface of the inner partition, it is possible to emit light in a specified direction with high efficiency by means of the first electrode formed in the inner wall surface. In particular, the present invention is suitable for a large light-emitting device in which a planar area of the light-emitting element is relatively large.

In the light-emitting device of the present invention, the inner wall surface of the partition or the inner partition may have an inclined angle of about 45° to the surface of the base substrate.

If doing so, it is possible to make the inclined angle of the first electrode formed in the inner wall surface about 45°, and thus it is possible to allow light propagate inside the functional layer to be emitted toward the front side of the light-emitting device with high efficiency.

In the light-emitting device of the present invention, reflection preventing means may be provided in an outer surface side of the second electrode.

If doing so, it is possible to prevent external light from being reflected in the second electrode which is arranged in a display screen of the light-emitting device. Thus, it is possible to provide the light-emitting device having excellent visibility.

In the light-emitting device of the present invention, the second electrode may have a transparent conductive film having transmittance, and an auxiliary electrode for assisting conductance of the transparent conductive film, and in the auxiliary electrode, the opening for transmitting light from the light-emitting layer may be provided.

Here, the transparent conductive film is preferably formed on an entire surface of the functional layer. Further, the auxiliary electrode is preferably formed on a surface of the transparent conductive film. In addition, the auxiliary electrode preferably is reflective.

In such a light-emitting device, if electrical power is supplied to the functional layer interposed between the first electrode and the second electrode, electrical power is supplied between the transparent conductive film and the first electrode, and simultaneously the auxiliary electrode assists the conductance of the transparent conductive film, such that electrical power is supplied to the functional layer. In the light-emitting layer supplied with the electrical power in such a manner, emitted light is generated. Further, the emitted light is multi-reflected between the first electrode and the auxiliary electrode, and propagates in a surface direction in the functional layer and the transparent conductive film. Thus, it is possible to emit the emitted light outside the functional layer in the opening of the auxiliary electrode. That is, in the present light-emitting device, since the auxiliary electrode advances the conductance of the transparent conductive film, it is possible to supply efficiently the electrical power to the functional layer, and the generated light can be emitted with high efficiency, such that it is possible to realize bright display. Further, since the transparent conductive film is formed in the entire surface of the functional layer, it is possible to increase an area of the transparent conductive film contacting the functional layer, as compared with the case in which the electrode contacts a portion of the functional layer. Thus, it is possible to increase the light-emitting region, as compared with the case in which the electrode is formed in a portion of the functional layer.

Therefore, as described above, if the auxiliary electrode assists the conductance of the transparent conductive film, it is possible to increase the conductance, and simultaneously it is possible to increase the light-emitting region. As a result, it is possible to further improve the emission efficiency of light.

Further, a light-emitting device of the present invention comprises, on a substrate, a pair of electrodes opposing each other, and a functional layer having a light-emitting layer interposed between the electrodes, in which a wiring line for shielding a display region of the substrate between the substrate and the light-emitting layer, a reflecting surface is formed at a side of the wiring line that faces the light-emitting layer, and an opening that transmits light from the light-emitting layer is formed in a side portion of the wiring line.

Here, the wiring line means various wiring lines such as a wiring line of a switching element, such as TFT, a power supply line for supplying a current to the light-emitting layer or a capacitance line for storing a predetermined potential.

In such a light-emitting device, when the light-emitting layer emits light, the emitted light may be directly emitted from the opening outside the substrate or be collided with the wiring line. Here, since the reflecting surface is formed in the wiring line, the emitted light is reflected by the reflecting surface of the wiring line or the electrode and emitted from the opening, or after propagating in a horizontal direction of the light-emitting layer by means of multi-reflection, the emitted light is emitted from the opening.

Therefore, even when the wiring line is formed so as to shield the display region, the emitted light is reflected and emitted from the opening. Thus, it is possible to improve the emission efficiency of light. Further, it is apprehended that, when a large light-emitting device is implemented, a width of the wiring line becomes large to reduce the resistance of the wiring line, and then the display region is shielded, which results in decreasing the emission efficiency of light. However, by adopting the above-mentioned construction, it is possible to suppress the emission efficiency of light decreasing. Therefore, a degree of freedom for a wiring structure or a wiring pattern increases, and thus it is possible to allow the TFT wiring line or the power supply line to be spread in a desired position. As a result, it is possible to easily implement a large light-emitting device.

Further, since emitted light is emitted from the opening formed in the side portion of the wiring line, for example, by forming the wiring line in a desired pattern, it is possible to allow emitted light to be emitted from the desired opening. Further, in the case in which an intensity of emitted light is biased due to the shape of the light-emitting layer or the electrode, a pattern of the wiring line is positively adjusted and the opening is formed at a desired position, such that the emitted light is efficiently emitted. Thus, it is possible to further improve the emission efficiency of light.

Moreover, the above-mentioned construction is effective, in particular, in the case of the so-called bottom-emission structure in which the emitted light is emitted from the substrate side, on which the TFTs or various wiring lines are formed.

Further, in the light-emitting device, the wiring line may be formed so as to plurally branch off to the light-emitting layer.

In such a manner, the wiring line is plurally branched off, a plurality of branch wiring lines are formed, and between the branch wiring lines, openings are formed. Therefore, it is possible to allow emitted light to be emitted from the openings adjacent to the branch wiring lines. Here, by forming the branch wiring lines in a desired pattern, it is possible to allow emitted light to be emitted from the desired opening. Further, in the case in which the intensity of emitted light is biased due to the shape of the light-emitting layer or the electrode, the wiring line is positively branched off, and the opening is formed in a desired position, such that the emitted light is efficiently emitted. Thus, it is possible to further improve the emission efficiency of light. Further, since multi-reflection can be avoided, it is possible to suppress attenuation of emitted light due to the multi-reflection.

Further, in the above-mentioned light-emitting device, the reflecting surface may have light scattering property to scatter emitted light.

In such a manner, if the reflecting surface has light scattering property, it is possible to scatter emitted light colliding onto the reflecting surface. Therefore, it is possible to prevent emitted light from being biased in a reflecting direction.

Further, preferably, light scattering property described in the present specification does not reflect the emitted light toward the light-emitting layer. If doing so, since multi-reflection can be avoided, it is possible to suppress attenuation of emitted light due to the multi-reflection.

Further, in the above-mentioned light-emitting device, one of the electrodes that interpose the light-emitting layer may be reflective.

Here, preferably, 'one of the electrodes that interpose the light-emitting layer' is an electrode positioned at a side opposite to the wiring line as viewed from the light-emitting layer.

In such a manner, if the electrode is reflective, it is possible to allow the emitted light from the light-emitting layer toward the electrode or the emitted light reflected by the wiring line to be reflected toward the wiring line or the opening.

Further, in the above-mentioned light-emitting device, the light-emitting layer may have an uneven surface at a side opposite to the wiring line.

In such a manner, if the light-emitting layer has the uneven surface, it is possible to allow emitted light to be emitted depending on the shape of the uneven surface.

Further, if the electrode being the reflective is formed so as to cover the uneven surface, it is possible to allow emitted light to be emitted in a normal direction of the uneven surface.

Further, if the uneven surface is formed in a desired shape, it becomes possible to condense emitted light in a desired position, and thus it is possible to increase the intensity of light-emitting partially. Further, by allowing emitted light to be directly emitted from the opening or by allowing emitted light to be reflected and emitted, it is possible to further improve the emission efficiency of light.

Further, in the above-mentioned light-emitting device, an angle which a vertical direction of the substrate and the uneven surface make in an end portion of the uneven surface may be in the range of 30° to 50°.

If doing so, it is possible to favorably obtain the advantages according to the uneven surface.

Further, in the above-mentioned light-emitting device, a top portion or a bottom portion in the uneven surface may correspond to the opening.

If doing so, it is possible to favorably obtain the advantages according to the uneven surface.

Further, in the above-mentioned light-emitting device, a reflecting portion may be formed in the substrate.

In such a manner, if the reflecting portion is formed in the substrate, it is possible to allow emitted light from the opening to be surely emitted to the viewer side. Therefore, it is possible to further promote the above advantages.

Further, in the above-mentioned light-emitting device, a light absorbing layer may be formed between the substrate and the wiring line.

If doing so, since the reflection of external light from the viewer side is prevented, it is possible to advance contrast.

In the light-emitting device of the present invention, the functional layer may have an organic electroluminescent material. That is, according to the present invention, a light-emitting device comprising an organic EL element as a light-emitting element is provided.

Further, a method of manufacturing a light-emitting device of the present invention, the light-emitting device comprising, on a substrate, a pair of electrodes opposing each other, and a functional layer having a light-emitting layer interposed between the electrodes, the method comprising a step of forming a wiring line for shielding a display region of the substrate between the substrate and the light-emitting layer, in which the wiring line has a reflecting surface formed at a side that faces the light-emitting layer.

In addition, an opening for transmitting light from the light-emitting layer is formed in a side portion of the wiring line.

If doing so, even though the wiring line is formed so as to shield the display region, emitted light is reflected and emitted from the opening, and thus it is possible to improve the emission efficiency of light. Further, when the large light-emitting device is implemented, a width of the wiring line becomes large to reduce the resistance of the wiring line, and then the display region is shielded, which results in decreasing the emission efficiency of light. However, by adopting the above-mentioned construction, it is possible to suppress the emission efficiency of light decreasing. Therefore, a degree of freedom for a wiring structure or a wiring pattern increases, and thus it is possible to allow the TFT wiring line or the power supply line to be spread in a desired position. As a result, it is possible to easily implement a large light-emitting device.

Further, since the emitted light is emitted from the opening formed in the side portion of the wiring line, for example, by forming the wiring line in a desired pattern, it is possible to allow emitted light to be emitted from the desired opening. Further, in the case in which the intensity of emitted light is biased due to the shape of the light-emitting layer or the electrode, a pattern of the wiring line is positively adjusted and the opening is formed at a desired position, such that the light is efficiently emitted. Thus, it is possible to further improve the emission efficiency of light.

Moreover, the above-mentioned construction is effective, in particular, in the case of the so-called bottom-emission structure in which the light is emitted from the substrate side, on which the TFTs or various wiring lines are formed.

Further, the above-mentioned method of manufacturing a light-emitting device may further comprise a step of forming a partition which isolates a plurality of light-emitting layers, and a step of forming the light-emitting layer adjacent to the partition by using a liquid droplet ejection method.

In addition, lyophilic treatment or liquid-repellent treatment is preferably performed, such that the surface of the partition has relatively lyophilic property or liquid-repellency.

If doing so, by ejecting a material for the light-emitting layer in the vicinity of the partition using the liquid droplet ejection method, it is possible to allow the partition and the light-emitting layer to contact each other at a desired angle due to various causes such as liquid-repellency of the partition, lyophilic property of a base, or evaporation characteristics of a solvent of the material for the light-emitting layer. Therefore, it is possible to easily form the above-mentioned uneven surface.

Next, an electronic apparatus of the present invention comprises a light-emitting device of the present invention as described above.

Here, as the electronic apparatus, for example, an information processing device such as a cellular phone, a mobile information terminal, a watch, a word processor, or a personal computer may be exemplified.

Therefore, according to the present invention, since the electronic apparatus uses the light-emitting device described above as a display unit, the electronic apparatus comprises the display unit which can display bright image with high quality, high reliability, high brightness and high contrast.

Further, since the electronic apparatus can reduce brightness irregularity of the light-emitting element, for example, it is possible to suitably apply an electronic apparatus comprising a large display unit of 20-inch diagonal or more.

DETAILED DESCRIPTION OF PREFERRED EMBODIMENTS

First Embodiment

Figure 1:
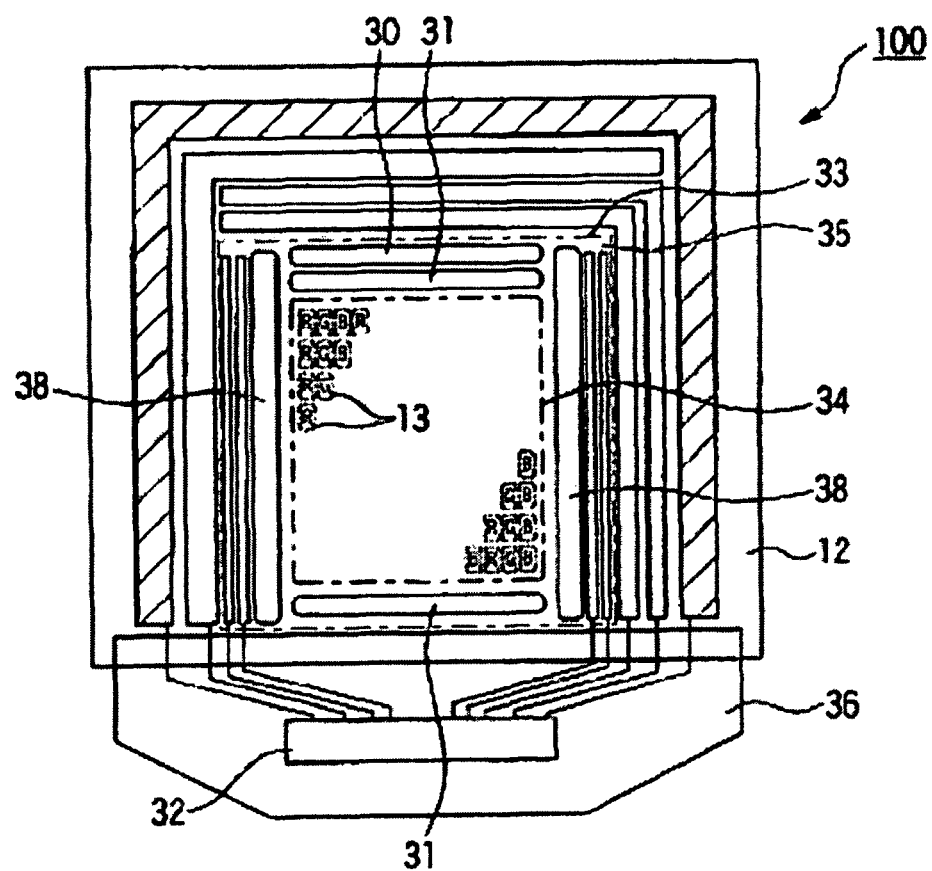
FIG. 1 is an overall plan view showing the construction of an organic EL device according to a first embodiment of the present invention.

Hereinafter, a light-emitting device, a manufacturing method thereof, and an electronic apparatus according to the present invention will be described with reference to the drawings.

Moreover, the embodiments described below are just an example of the present invention, and is not intended to limit the present invention. The present invention can be arbitrarily modified within the technical scope of the present invention. Further, in the respective drawings shown below, the respective layers or members are shown in a recognizable size in the drawings, and thus the respective layers or members are shown in reduced scales different from each other.

Figure 2:
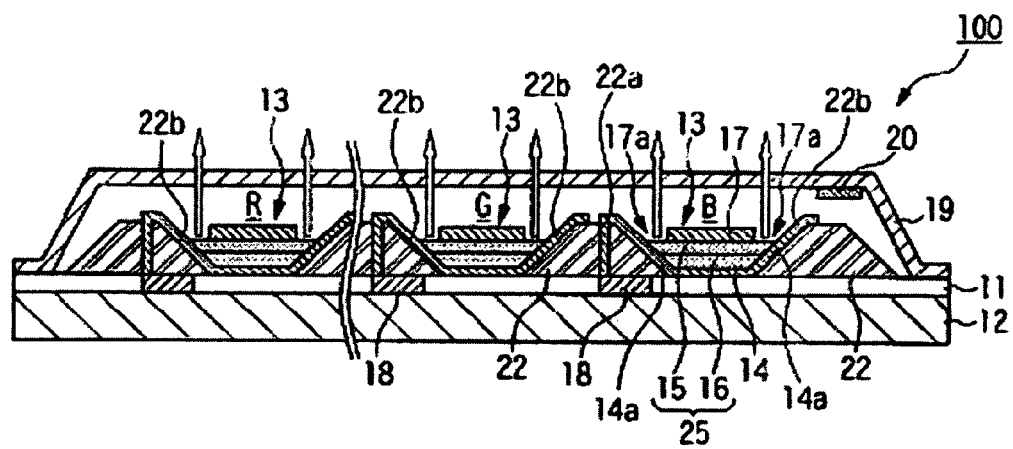
FIG. 2 is a partial cross-sectional showing the construction of the organic EL device according to the first embodiment of the present invention.
Figure 3:
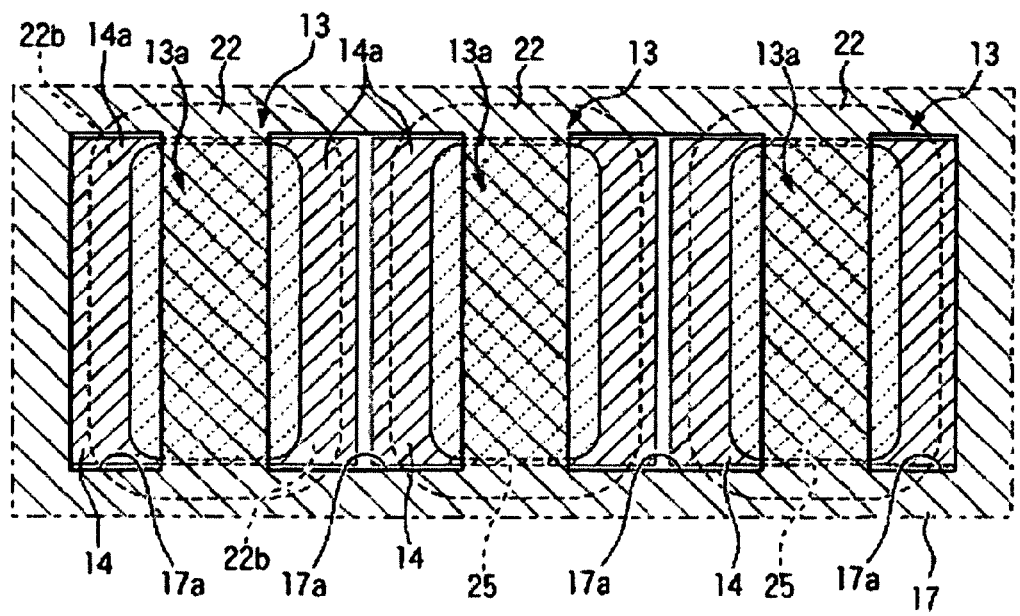
FIG. 3 is a plan view showing the construction of a plurality of light-emitting elements of the organic EL device according to the first embodiment of the present invention.

FIG. 1 is an overall plan view of the construction of an organic electroluminescent (organic EL) device according to an embodiment of a light-emitting device of the present invention, FIG. 2 is a partial cross-sectional view of the organic EL device, and FIG. 3 is a plan view of the construction of a plurality of light-emitting elements of the organic EL device. The organic EL device of the present embodiment is a top-emission-type organic EL device in which light output from the light-emitting layer is emitted from the element forming side, and also it is an active matrix mode organic EL device in which switching elements are provided corresponding to the respective light-emitting elements.

First, based on FIG. 1, the overall construction of the organic EL device of the present embodiment will be described.

The organic EL device 100 of the present embodiment comprises a pixel portion 33 having an approximately rectangular shape in plan view (within the one-dot chain line box in FIG. 1), in which pixel electrodes connected to light-emitting element driving units (not shown) are arranged on an electrical insulating substrate (base substrate) 12 in the form of a matrix. The pixel portion 33 is divided into a display region 34 (in FIG. 1, within the two-dot chain line box) in a central portion and a dummy region 35 (the region between the one-dot chain line and the two-dot chain line) arranged in the vicinity of the display region 34. In the display region 34, referring to FIG. 1, pixels are arranged in a matrix so as to be separated from each other in all directions, each pixel having light-emitting elements (organic EL elements) 13 of three colors (R, G and B) having respective pixel electrodes. Further, at the left and right sides of the display region 34 in FIG. 1, scanning line driving circuits 38 are arranged, and at the upper and lower sides of the display region 34 in FIG. 1, data line driving circuits 31 are arranged. The scanning line driving circuits 38 and the data line driving circuits 31 are arranged in the periphery of the dummy region 35. Moreover, in FIG. 1, scanning lines and data-lines are omitted.

In addition, above the data driving circuit 31 in FIG. 1, a test circuit 30 is arranged. The test circuit 30 is a circuit for testing operating conditions of the organic EL device 100. For example, the test circuit 30 comprises test information output means (not shown) that outputs test results to the outside. The test circuit 30 is constructed to test the quality and defects of an organic EL device during manufacture or at the time of shipment. Moreover, the test circuit 30 is also arranged inside the dummy region 35. Further, a driving external substrate 36 is connected to the substrate 12, and an external driving circuit 32 is mounted on the driving external substrate 36.

Next, referring to the cross-sectional structure shown in FIG. 2, a plurality of light-emitting elements (pixels) 13 provided on a surface of the substrate 12 are electrically connected to light-emitting element driving units 18 respectively provided corresponding to the light-emitting elements 13. The light-emitting elements 13 are provided in regions surrounded by banks (partitions) 22 erected on the substrate 12 and each comprise an EL layer (functional layer) 25 interposed between an anode (first electrode) 14 and a cathode (second electrode) 17. The EL layer 25 has a light-emitting layer 15 mainly containing an organic electroluminescent material and a hole injecting/transporting layer 16. Further, in the element forming surface side of the substrate 12, a transmissive sealing substrate 19 is attached to the surface of the substrate at the side where the elements are formed.

In the present embodiment, all the anodes 14 and the cathodes 17 are formed with a reflective metallic film such as silver, gold, or aluminum. Further, the cathode 17 is partially formed within a planar region of the anode 14 and has an opening 17a in a planar region of the light-emitting element 13. Based on such a construction, in a region corresponding to the opening 17a of the cathode 17, portions of the anode 14 and the EL layer 25 are exposed at an upper surface of the light-emitting element 13. The exposed regions form light-emitting portions which emit output light of the light-emitting element 13. In FIG. 2, three EL layers 25 have light-emitting layers of three colors, red (R), green (G) and blue (B), respectively, for example, and the three light-emitting elements 13 (pixels) constitute a unit of display of the organic EL device 100.

The bank 22 surrounding the light-emitting element 13 is formed in an approximately trapezoidal shape in cross-section, as shown in FIG. 2, and an inner wall surface 22b at the light-emitting element 13 side is inclined with respect to the surface of the substrate. In an upper surface of the bank 22, a contact hole 22a reaching the light-emitting element driving unit 18 is provided, and the light-emitting element 13 is electrically connected to the light-emitting element driving unit 18 provided on an underlying element forming layer 11, by means of the cathode 17 of which a portion is buried in the contact hole 22a. The anode 14 and the light-emitting element driving unit 18 may be directly connected with an insulating layer 11 interposed therebetween. The light-emitting element driving unit 18 is intended to supply electrical power depending on the display grayscale level to the light-emitting element 13. As the light-emitting element driving unit 18, for example, a circuit comprising a pixel-selection switching element for outputting voltage application information depending on data to be supplied from a display circuit to the light-emitting element 13 and a pixel-drive switching element for applying a voltage to be supplied from a power supply line based on voltage application information to be outputted from the pixel-selection switching element to the light-emitting element 13 may be used.

Further, the sealing substrate 19 and the substrate 12 are adhered via an adhering layer which is not shown, and the organic EL element 13 is sealed by means of the sealing substrate 19 and the adhering layer. Further, in the inner surface of the sealing substrate 19, a drying agent 20 for removing moisture in the sealed space is provided. Instead of providing the adhering layer between the sealing substrate 19 and the substrate 12, an inert gas may be provided. As described above, the organic EL device 100 shown in FIG. 1 is a top-emission-type organic EL device in which light output from the light-emitting layer 16 is emitted from the sealing substrate 19 side to the outside.

Next, referring to the planar structure shown in FIG. 3, in the respective light-emitting elements 13, the rectangular anode 14 in plan view and the EL layer 25 are provided inside the bank 22 having the approximately rectangular opening in plan view, and the cathode 17 having a plurality of rectangular openings (light-emitting portions) 17a are formed to cross over the plurality of light-emitting elements 13. The opening 17a provided in the cathode 17 is provided at a position almost overlapping the planar region of the anode 14 formed on the inner wall surface 22b of the bank 22. Further, in the light-emitting elements 13 of both ends, outsides in left and right directions of the cathode 17 in FIG. 3 are also formed as the openings 17a. And then, inside the bank 22, a portion which the anode 14, the EL layer 25 and the cathode 17 overlap in plan view constitutes the light-emitting region 13a of the light-emitting element 13. In order to electrically isolate the anode 14 and the cathode 17 of the light-emitting element 13, a portion of the anode 14a formed on the inner wall surface 22b of the bank 22, which the EL layer 25 is not arranged, falls within a region of the opening 17a provided in the cathode 17. In order to electrically isolate the anode 14 and the cathode 17 of the light-emitting element 13 surely, an insulating layer (not shown) may be arranged on the anode 14a formed on the inner wall surface 22b of the bank 22.

In the organic EL device 100 of the present embodiment comprising the above-mentioned construction, if the electric power is supplied from the light-emitting element driving unit 18 to the light-emitting element 13, the light-emitting layer 15 emits in the light-emitting region 13a in which the EL layer 25 is interposed between the electrodes. Since the anode 14 and the cathode 17 with the EL layer 25 interposed therebetween are formed with a metallic film being reflective, light generated in the light-emitting region 13a is reflected between both electrodes and propagates in a planar direction of the EL layer 25. And then, if light propagating inside the EL layer 25 reaches the outside of the cathode 17, light is emitted from the light-emitting portion 17a to be opened upward in FIG. 2 to the sealing substrate 19 side.

Here, in the light-emitting element 13, since the anode 14 is formed on the substrate 12 along the inner wall surface 22b inclined with respect to the surface of the substrate 12, the anode 14 has an approximately boat shape in which it is erected from the substrate surface in both side portions of the light-emitting element 13. That is, the anode 14 has inclined surface portions 14a and 14a inclined with respect to the substrate 12 in both side portions. Accordingly, light propagating from the light-emitting region 13a to the outside is reflected by the inclined surface portions 14a and 14a of the anode 14 to be outputted from the light-emitting portion 17a efficiently.

In such a manner, in the anode 14 serving as emitting means that emits light generated inside the device, in order to reflect output light efficiently upward the substrate, the inclined angle of the inclined surface portion 14a to the surface of the substrate is preferably in the range of 35° and 55°, about 45°. In addition, the inclined surface portions 14a (that is, the inner wall surface 22b of the bank 22) may have a curved shape.

In such a manner, according to the organic EL device 100 of the present embodiment, light generated in the light-emitting region 13a of the light-emitting element 13 can be reflected by the anode 14 and the cathode 17 with the EL layer interposed therebetween, be guided to the light-emitting portion 17a, and be outputted with high directivity from the light-emitting portion 17a upward the substrate 12. That is, the present organic EL device is the top-emission-type organic EL device, but, since output light from the light-emitting element 13 doesn't transmit the transparent electrode, it becomes possible to emit the output light with high efficiency. In addition, since the second electrode is not made of a transparent conductive material such as metallic oxide, it is possible to use material having a low work function, such as an alkali metallic material of Li or Na, or an alkali earth metallic material of Be, Mg or Ca, as the electron injecting layer. Thus, it is possible to inject electrons into the light-emitting layer efficiently, and it is possible to advance brightness of light from the light-emitting element. Further, as the electron injecting layer, it is possible to use relatively thin layer, and thus a material having low transmittance may be used.

Further, since the anode 14 and the cathode 17 are formed with the metallic film, it is possible to obtain high reliability, as compared with a conventional construction in which an upper electrode is made of a transparent conductive material such as ITO. In addition, since it has drastically low resistance as compared with the transparent conductive material, a voltage drop in the cathode 17 to be formed on an almost entire surface of the display region 34 is difficult to be generated, and thus display irregularity is difficult to be caused even in the case of the large organic EL device.

Hereinafter, a specified example of the construction of the respective elements of the organic EL device 100 will be described.

In the organic EL device 100 shown in FIG. 1, as a material for the substrate 12, glass, quartz, sapphire, synthesized resin material such as polyester, polyacrylate, polycarbonate, polyetherketone, and the like may be exemplified. As the substrate 12, other than the non-transparent material, a transparent or a translucent material which can transmit light may be used. In particular, low-priced glass is suitable used.

The anode 14 is made of a metallic film being reflective, such as gold or silver. In the case in which as the metallic film, gold or silver is used, since its work function is large (preferably, 4.6 eV or more), it is suitable to form the anode 14 with a single metallic film. Alternatively, it may be applied to a laminate having other conductive film. The anode 14 may be formed with a known film-forming method such as a sputtering method or a vapor deposition method.

The cathode 17 is made of a metallic film being reflective, such as aluminum, gold or silver. That is, the cathode 17 may be formed with a single metallic film or may be formed with a laminate in which a layer made of a material having a low work function, such as an alkali metallic material of Li or Na, or an alkali earth metallic material of Be, Mg or Ca, is provided on the metallic film at the EL layer 25 side. The cathode 17 may be formed with the known film-forming method. However, in order to prevent the EL layer 25 from damaging at the time of film-forming, preferably, the cathode 17 is selectively formed with a mask vapor deposition method which uses a metal mask.

In addition, in the outside of the cathode 17, the reflection preventing film (reflection preventing means) may be provided. Since the cathode 17 is arranged at the transmissive sealing substrate 19 side and is viewed by a viewer, if light incident to the organic EL device 100 is reflected by the cathode 17, visibility of display may be lowered. However, in the present embodiment, since the above-mentioned reflection preventing film is provided, it is possible to prevent visibility from being lowered due to reflected light. Further, it dedicates to increase contrast to the light-emitting portion 17a and to advance display quality.

As the hole injecting/transporting layer 16, for example, a high molecular material such as polythiophene, polystyrenesulfonic acid, polypyrrole, polyaniline or its derivative may be exemplified. Further, in the case of using a low molecular material, the hole injecting layer and the hole transporting layer are preferably deposited. As a material for the hole injecting layer, for example, copper phthalocyanine (CuPc), polyphenylenevinylene such as polytetrahydrothiophenylphenylene, 1,1-bis-(4-N,N-ditolylaminophenyl)cyclohexane or tris(8-hydroxyquinolinol)aluminum may be exemplified. In particular, it is preferable to use copper phthalocyanine (CuPc). Further, as the hole transporting layer, triphenylamine derivative (TPD), pyrazoline derivative, arylamine derivative, stilbene derivative, or triphenyldiamine derivative may be exemplified. More specifically, materials described in Japanese Unexamined Patent Application Publication Nos. 63-70257, 63-175860, 2-135359, 2-135361, 2-209988, 3-37992, and 3-152184 may be exemplified. In particular, triphenyldiamine derivative is preferably used, and more preferably, 4,4'-bis(N(3-methylphenyl)-N-phenylamino)biphenyl. Moreover, any one of the hole transporting layer and the hole injecting layer may be formed.

As a material for the light-emitting layer 15, light-emitting materials such as high molecular light-emitting body or low molecular organic light-emitting body, that is, various fluorescent materials or phosphorescent materials may be used. Among conjugated high molecular materials for light-emitting material, a material containing arylenevinylene or polyfluorene is particularly preferable. Among low molecular light-emitting bodies, for example, naphthalene derivative, anthracene derivative, perylene derivative, polymethine-based pigment, xanthene-based pigment, coumarin-based pigment, cyanine-based pigment, 8-hydroquinoline and metal complex of its derivative, aromatic amine, tetraphenyl-cyclopentadiene derivative or known materials described in Japanese Unexamined Patent Application Publication Nos. S57-51781 and S59-194393 may be used.

Moreover, between the cathode 17 and the light-emitting layer 15, if necessary, the electron transporting layer or the electron injecting layer may be formed. A material for the electron transporting layer is not particularly limited, and, for example, oxadiazole derivative, anthraquinodimethane and its derivative, benzoquinone and its derivative, naphthoquinone and its derivative, anthraquinone and its derivative, tetracyanoanthraquinodimethane and its derivative, fluorenone derivative, diphenyldicyanoethylene and its derivative, diphenoquinone derivative, 8-hydroxyquinoline and metal complex of its derivative may be used. More specifically, similarly to the above-mentioned material for the hole transporting layer, materials described in Japanese Unexamined Patent Application Publication Nos. S63-70257, S63-175860, H2-135359, H2-135361, H2-209988, H3-37992 and H3-152184 may be exemplified. In particular, 2-(4-biphenylyl)-5-(4-t-butylphenyl)-1,3,4,-oxadiazole, benzoquinone, anthraquinone, or tris(8-quinolinol)aluminum is suitably used.

As the sealing substrate 19, for example, a glass substrate is used, but, if it is transparent and has excellent gas barrier property, for example, a member other than the glass substrate, such as plastic, a laminate film of plastic or a laminate film-forming substrate, or a laminate film of glass may be used. Further, as a protective layer, a member which can absorb ultraviolet ray may be used.

The functional layer having the light-emitting layer 15 in the organic EL device 100 shown in FIGS. 1 to 3 may be formed with the liquid droplet ejection method (ink jet method). When the functional layer is formed with the liquid droplet ejection method, the bank 22 having the openings in an approximate lattice shape in plan view is formed in the region in which the functional layer is to be formed. And then, by an ejection head of a liquid droplet ejection device, a liquid material containing the material for the functional layer is ejected to the openings of the bank 22, such that the functional layer is formed in a predetermined position.

Here, the ejection head of the liquid droplet ejection has an ink jet head. As the ink jet method, a piezo jet method in which a fluid is ejected by means of change in volume of a piezoelectric element or a method in which an electrothermal converting body is used as an energy generating element may be used. Moreover, the liquid droplet ejection device may be a dispenser device. Further, the liquid material means a medium having viscosity enough to be discharged from a nozzle of the ejection head, irregardless of watery or oily nature. What is necessary is to have liquidity (viscosity) capable of being ejected from the nozzle or the like. Even when the solid material is mixed, what is necessary is just a liquid as a whole. Further, the solid material to be contained in the liquid material may be melted by heating above the melting point, or may be distributed in a solvent as particles. In addition, functional materials such as dyes or pigments other than the solvent may be added.

Though the details are not shown, the organic EL device 100 of the present embodiment is an active matrix type, and actually, a plurality of data lines and a plurality of scanning lines are formed on the element forming layer 11 in an approximate lattice shape in plan view. And then, as regards pixels which are divided by the data lines or the scanning lines and arranged in a matrix, for every pixel, the light-emitting element 13 is connected via a driving TFT such as a switching transistor or a driving transistor. If a driving signal is supplied via the data line or the scanning line, a current flows between the electrodes. And then, the light-emitting layer 15 of the light-emitting element 13 emits light and light is emitted from the light-emitting portion 17a outside the sealing substrate 19. As a result, the pixel is turned on.

Second Embodiment

Figure 4:
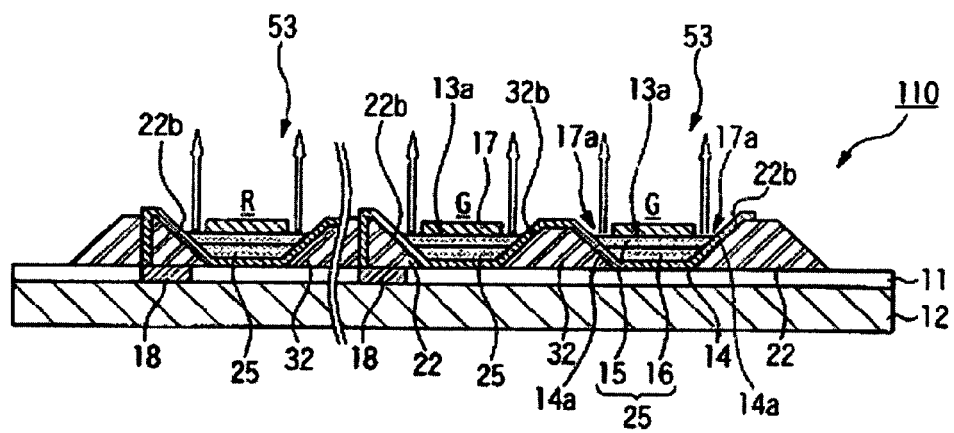
FIG. 4 is a partial cross-sectional view showing the construction of an organic EL device according to a second embodiment of the present invention.

Next, a second embodiment of the present invention will be described with reference to FIG. 4. FIG. 4 is a partial cross-sectional view showing the construction of an organic EL device 110 of the present embodiment, and corresponds to FIG. 2 in the organic EL device 100 of the first embodiment. In FIG. 4, the sealing substrate is not shown, but the organic EL device 110 of the present embodiment has the same elements as those of the organic EL device 100 described above, except that inside the bank 22 dividing the respective light-emitting elements, a sub-bank (inner partition) 32 is provided to additionally divide the corresponding region. Therefore, in the following description and FIG. 4, the same elements as those of the first embodiment are represented by the same reference numerals, and the descriptions on the same elements will be omitted.

The organic EL device 110 shown in FIG. 4 comprises a plurality of light-emitting elements 53. The respective light-emitting elements 53 are provided in regions surrounded by the bank 22 erected on the substrate 12. The respective light-emitting elements 53 have the construction in which the EL layer 25 is interposed between the anode 14 and the cathode 17, and are divided by the sub-bank 32 provided in the same layer as the bank 22 in plan view. And then, in regions divided by the sub-bank 32, the anode 14 and the cathode 17 oppose each other with the EL layer 25 interposed therebetween, such that a plurality of (in FIG. 4, two) light-emitting regions 13a are formed. The cathode 17 is partially formed within the planar region of the anode 14, similarly to the first embodiment, and thus at both sides of the light-emitting region 13a, the openings 17a are formed so as to constitute the light-emitting portions. At the positions of the respective openings 17a, the anode 14 formed on the bank 22 and the sub-bank 32 has the inclined surface portions 14a following the inner wall surfaces of the bank 22 and the sub-bank 32.

In the organic EL device 110 of the present embodiment comprising the above-mentioned construction, by a current to be supplied from the light-emitting element driving unit 18 conductively connected to the anode 14 via the contact hole, the light-emitting layer 15 of the light-emitting region 13a emits light, and then light is reflected between the anode 14 and the cathode 17 and is guided to both sides of the light-emitting region 13a, such that light is outputted from the light-emitting portions (the openings of the cathode) 17a provided at plural positions. The anode 14 and the light-emitting element driving unit 18 may be directly connected with the insulating layer 11 interposed therebetween. In such a manner, the light-emitting element 13 is divided in plan view, and a plurality of light-emitting regions 13a and the light-emitting portions 17a corresponding thereto are provided. Thus, even when the relatively large pixel is formed, it is possible to obtain high the emission efficiency of light. Therefore, according to the organic EL device 110 of the present embodiment, it is possible to realize large screen display with high brightness.

Further, in the present embodiment, preferably, the inclined surface portion 14a of the anode 14 formed in the light-emitting portion 17a has an angle of about 45° to the main surface of the substrate 12. That is, the inner wall surface 32b of the sub-bank 32 preferably has an angle of about 45° to the surface of the substrate. If doing so, brightness in the front direction of the organic EL device 110 becomes a maximum, and thus high brightness display in a viewer direction can be obtained.

Third Embodiment

Figure 5:
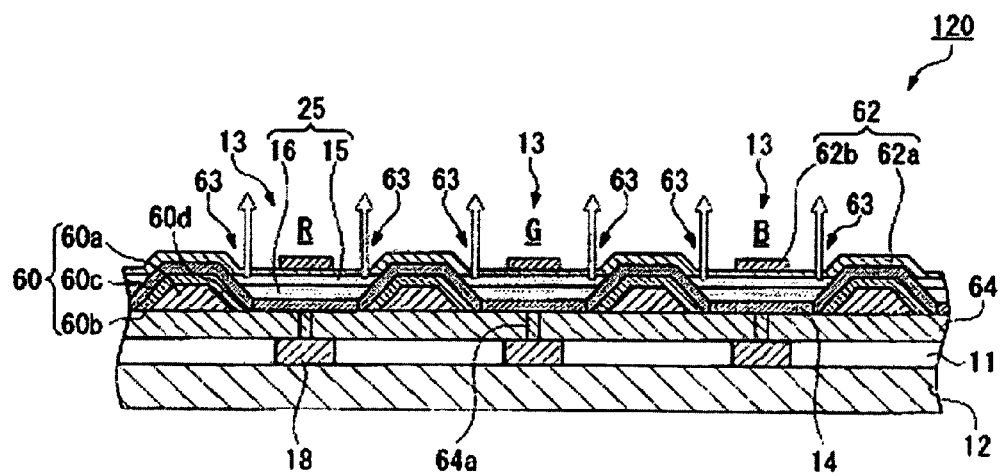
FIG. 5 is a partial cross-sectional view showing the construction of an organic EL device according to a third embodiment of the present invention.

Next, a third embodiment of the present invention will be described with reference to FIG. 5. FIG. 5 is a partial cross-sectional view showing the construction of an organic EL device 120 of the present embodiment and corresponds to FIG. 2 in the organic EL device 100 of the first embodiment.

Moreover, in FIG. 5, the sealing substrate is omitted. Further, in the present embodiment, different elements from those of the embodiments described above will be described. In addition, the same elements as those of the embodiments described above are represented by the same reference numerals, and the description thereon will be omitted.

The organic EL device 120 of the present embodiment has the same basic construction as that of the embodiments described above, a bank (partition) 60, a cathode (second electrode) 62 and an interlayer insulating film 64.

Here, in the bank 60, a first bank layer 60a, a second bank layer 60b and a third bank layer 60c are sequentially deposited on the interlayer insulating film 64. And then, the first bank layer 60a is formed so as to surround the light-emitting element 13, in a trapezoidal shape in cross-section as shown in FIG. 5. Further, an inner wall surface 60d at the light-emitting element 13 side is inclined with respect to the surface of the substrate. Further, the second bank layer 60b is a reflecting film formed following the shape of the first bank layer 60a, and it is made of a metallic film being reflective, such as silver, gold or aluminum. Further, the third bank layer 60c is a transparent resin film formed following the shape of the second bank layer 60b, and it is made of a resin film such as acryl. Therefore, the bank 60 has an approximate trapezoidal shape in cross-sectional view, and has a reflective and insulating surface.

Further, in the cathode 62, a transparent conductive film 62a and an auxiliary electrode 62b are deposited. And then, the transparent conductive film 62a is a transparent conductive film made of indium tin oxide (hereinafter, referred to as ITO) or the like. Further, other than ITO, a material in which zinc (Zn) is contained into metallic oxide, for example, indium oxide/zinc oxide-based amorphous transparent conductive film (indium zinc oxide: IZO) (Registered Trademark) (manufactured by Idemitsu Kosan Co., Ltd.) may be adopted. Such a transparent conductive film 62a is formed on an entire surface of the substrate 12, including the EL layer 25 and the bank 60.

Further, the auxiliary electrode 62b is formed partially on the transparent conductive film 62a within the planar region of the light-emitting element 13. Further, the auxiliary electrode 62b has conductance higher than that of the transparent conductive film 62a, and assists the conductance of the transparent conductive film 62a. Further, if the auxiliary electrode 62b is formed partially on the transparent conductive film 62a in such a manner, openings 63 of side portions of the auxiliary electrode 62b are formed. Further, the opening 63 is formed within the planar region of the light-emitting element 13. Further, in the opening 63, as described below, light emitted from the light-emitting layer 15 transmitting the transparent conductive film 62a passes, and the emitted light multi-reflected between the anode 14 and the auxiliary electrode 62b passes through the transparent conductive film 62a. Further, the emitted light reflected by the reflecting film of the second bank 60b passes through the transparent conductive film 62a. Based on such the construction, in a region corresponding to the opening 63 of the auxiliary electrode 62b, a portion of the EL layer 25 contact with the transparent conductive film 62a, and the contact portion constitutes the light-emitting portion to which light outputted from the light-emitting element 13 is emitted. The three EL layers 25 shown in FIG. 5 have light-emitting layers of three colors, red (R), green (G) and blue (B), respectively, for example, and the three light-emitting elements 13 (pixels) constitute a unit of display of the organic EL device 120.

Further, the interlayer insulating film 64 is an insulating film provided between the anode 4 and the light-emitting element driving unit 18, and the anode 14 and the light-emitting element driving unit 18 are connected to each other via a contact hole 64a formed in the interlayer insulating film 64.

A manufacturing method of such an organic EL device 120 will be described.

First, after forming the light-emitting element driving unit 18, the interlayer insulating film 64 and the contact hole 64a are formed. Next, the reflective anode 14 is formed (after forming Al, ITO is formed or other metallic film such as gold or silver having the high reflectance and a work function of 4.6 eV or more). Next, the first bank layer 60a is formed with acryl resin at a tapered angle of about 45°. Next, the reflecting metallic film is deposited to form the second bank layer 60b. Next, the third bank layer 60c is formed so as to cover the second bank layer 60b. Subsequently, the EL layer 25 is formed. If necessary, an electron blocking layer, a hole transporting layer, an electron transporting layer, an electron injecting layer, and a hole blocking layer are formed. Next, the transparent conductive film 62a is formed in a laminate of Ca/ITO, and additionally, the reflective auxiliary electrode 62b is deposited with a metallic material such as Al via a mask. And then, the opening 63 is opened as shown in FIG. 5.

In the organic EL device 120 constructed in such a manner, electrical power is supplied to the EL layer 25 interposed between the anode 14 and the cathode 62. And then, the electric power is supplied to the EL layer 25 interposed between the anode 14 and the transparent conductive film 62a, and further the auxiliary electrode 62b assists the conductance of the transparent conductive film 62a, such that the electric power is supplied to the EL layer 25. And then, in the EL layer 25 supplied with the electric power in such a manner, emitted light is generated. Further, the emitted light is multi-reflected between the anode 14 and the auxiliary electrode 62b by the second bank layer 60b, and propagates in a surface direction in the EL layer 25 and the transparent conductive film 62a. Thus, finally, the emitted light that transmits the transparent conductive film 62a is emitted from the opening 63 outside the organic EL device 120.

As described above, in the organic EL device 120 of the present embodiment, emitted light of the EL layer 25 can be multi-reflected between the anode 14 and the auxiliary electrode 62b, and further the emitted light can be reflected by the second bank layer 60b. Thus, it is possible to allow the emitted light to propagate in the surface direction in the EL layer 25 and the transparent conductive film 62a. And then, it is possible to allow emitted light transmitting the transparent conductive film 62a to be emitted from the opening 63.

Further, in the organic EL device 120, since the auxiliary electrode 62b advances the conductance of the transparent conductive film 62a, it is possible to supply the electric power to the EL layer 25 efficiently. Thus, it is possible to emit light with high efficiency, and further it is possible to realize bright display. Further, since the transparent conductive film 62a is formed on the entire surface of the EL layer 25, it is possible to increase the contact area to the EL layer 25, as compared with the case in which the electrode contacts a portion of the EL layer 25. Thus, it is possible to increase the light-emitting region, as compared with the case in which the electrode is formed in a portion of the EL layer 25.

Therefore, as described above, if the auxiliary electrode 62b assists the conductance of the transparent conductive film 62a, it is possible to increase the conductance, and simultaneously it is possible to increase the light-emitting region. As a result, it is possible to further improve the emission efficiency of light.

Fourth Embodiment

Figure 6:
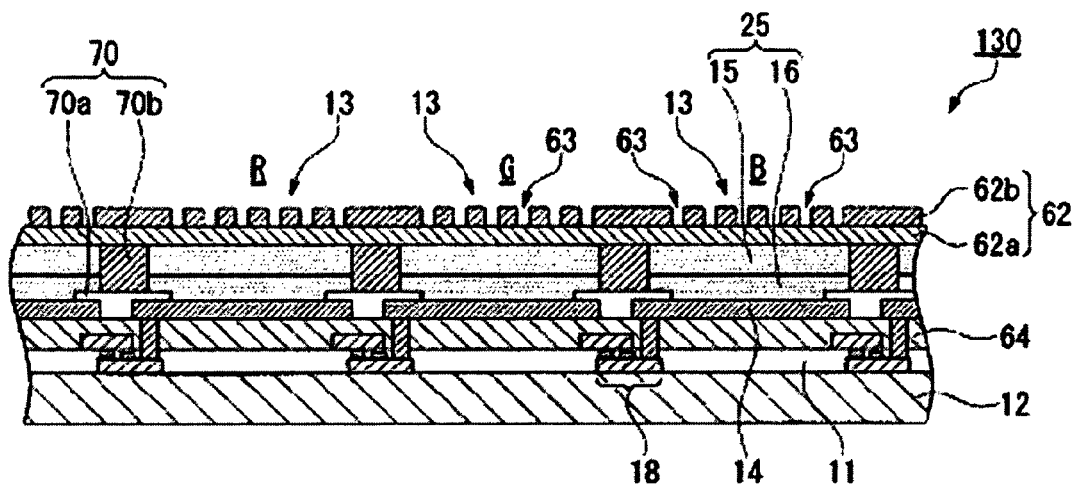
FIG. 6 is a partial cross-sectional view showing the construction of an organic EL device according to a fourth embodiment of the present invention.
Figure 7:
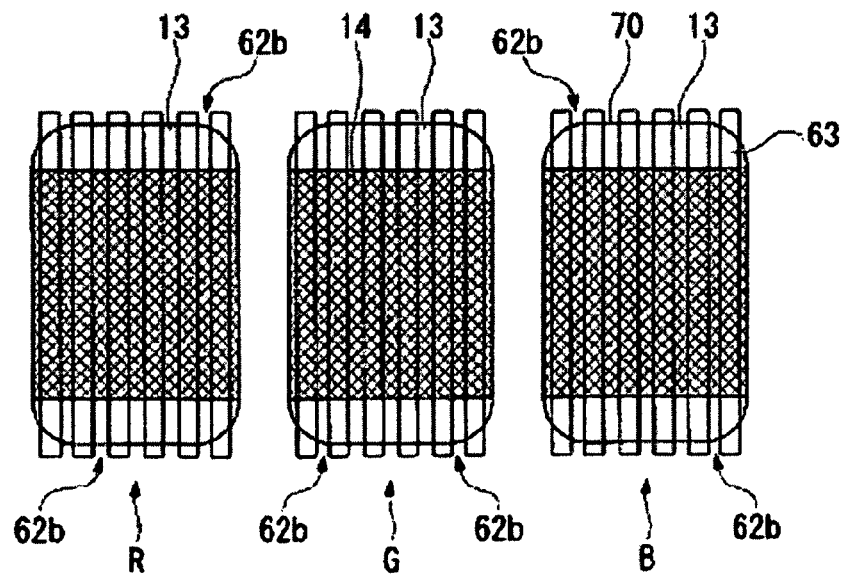
FIG. 7 is a plan view showing essential parts of the organic EL device according to the fourth embodiment of the present invention.

Next, a fourth embodiment of the present invention will be described with reference to FIGS. 6 and 7. FIG. 6 is a partial cross-sectional view showing the construction of an organic EL device 130 of the present embodiment, and it corresponds to FIG. 2 in the organic EL device 100 of the first embodiment. FIG. 7 is a plan view showing essential parts of the organic EL device 130, and it illustrates a position relationship of an auxiliary electrode, an anode and a bank.

Moreover, in FIG. 6, the sealing substrate is omitted. Further, in the present embodiment, different elements from those of the embodiments described above will be described. In addition, the same elements as those of the embodiments described above are represented by the same reference numerals, and the description thereon will be omitted.

As shown in FIG. 6, the organic EL device 130 of the present embodiment has the same basic construction as that of the organic EL device 120 as described above, and a bank (partition) 70.

Here, in the bank 70, a lyophilic bank layer 70a and a liquid-repellent bank layer 70b are sequentially deposited on the interlayer insulating film 64. And then, the lyophilic bank layer 70a is made of an inorganic material having high lyophilic property such as silicon oxide, and the liquid-repellent bank layer 70b is one which a fluorine plasma treatment is performed on acryl resin material. In such a bank 70, when the EL layer 25 is formed using the liquid droplet ejection method, the lyophilic bank layer 70a leaves the EL layer 25 on the anode 14. Thus, it becomes possible to form the EL layer 25 on the anode 14. Further, even when curved flight is generated in the liquid material ejected from the ejection head and the liquid material is coated on the liquid-repellent bank layer 70b, it becomes possible to float the light material on the anode 14 using the liquid repellency of the liquid-repellent bank layer 70b.

Further, in the organic EL device 130 of the present embodiment, for every light-emitting element 13, a plurality of openings 63 are formed. More specifically, as shown in FIGS. 6 and 7, in the light-emitting element 13 surrounded by the bank 70, a plurality of auxiliary electrodes 62b are branched off, and a plurality of openings 63 are formed in the side portions of the respective auxiliary electrodes 62b.

In such the construction, as compared with the organic EL device 120, it is possible to allow emitted light to be emitted from many openings 63. Here, the auxiliary electrode 62b is branched off in a desired pattern, and thus it is possible to allow emitted light to be emitted from a desired opening 63. Further, in the case in which the intensity of the emitted light is biased due to the shape of the light-emitting layer 15, the auxiliary electrode 62b is positively branched off and the opening 63 is formed at a desired position such that the emitted light is efficiently emitted. Thus, it is possible to further improve the emission efficiency of light. Further, in such a manner, since multi-reflection can be avoided, it is possible to suppress the attenuation of the emitted light due to the multi-reflection.

Therefore, in the organic EL device 130 of the present embodiment, in addition to the same advantages as those of the organic EL device 120 described above, it is possible to suppress attenuation of emitted light, and thus it is possible to further improve the emission efficiency of light.

In the respective embodiments, the active matrix type organic EL device is described, but the present invention is not limited to the active matrix type organic EL device. For example, the present invention can be applied to a simple matrix type organic EL device or a passive type organic EL device. In the respective embodiments, the organic EL device comprising the organic EL element as the light-emitting element is described, but the technical scope of the present invention is not limited to the embodiments. The present invention can be applied to a case in which a light-emitting element other than the organic EL element is used. In particular, the present invention can be applied to an organic EL device in which light is emitted from an upper surface of the light-emitting element erected on the substrate.

Fifth Embodiment

Figure 8:
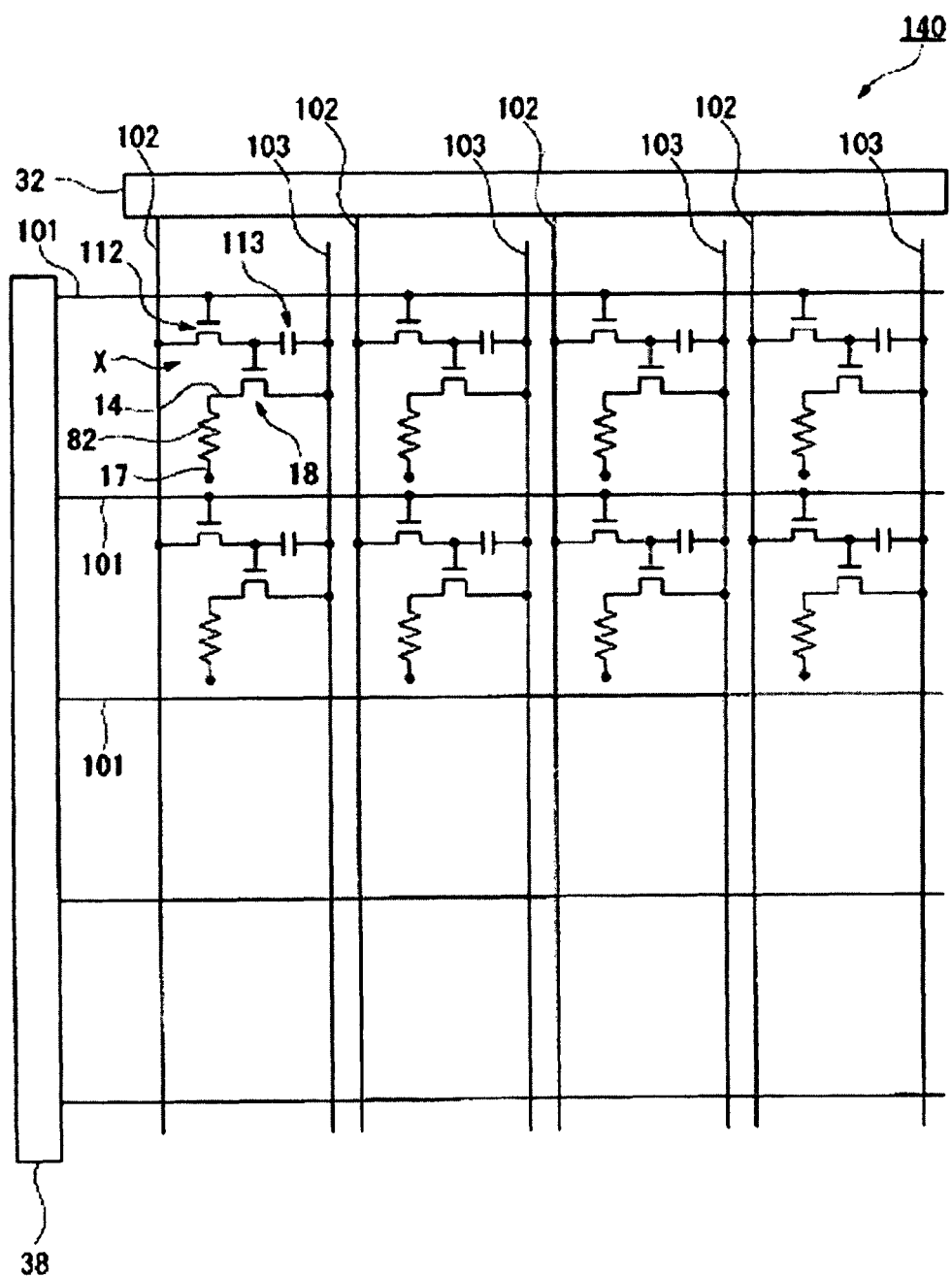
FIG. 8 is a schematic view showing a wiring line structure of an organic EL device according to a fifth embodiment of the present invention.

FIG. 8 is a schematic view showing a wiring line structure of an organic EL device according to the present embodiment.

The organic EL device (light-emitting device) 140 is an active matrix type organic EL device in which a thin film transistor (hereinafter, referred to as TFT) is used as a switching element.

As shown in FIG. 8, the organic EL device 140 has construction in which a plurality of scanning lines 101, a plurality of signal lines 102 extending in a direction intersecting orthogonally to the respective scanning lines 101, and a plurality of power supply lines 103 extending parallel to the respective signal line 102 are formed. Further, in the vicinities of intersections of the scanning lines 101 and the signal lines 102, pixel regions X are provided.

To the signal lines 102, a data line driving circuit 31 comprising shift registers, level shifters, video lines and analog switches is connected. Further, to the scanning lines 101, a scanning line driving circuit 38 comprising shift registers and level shifters is connected.

In addition, each pixel region X is provided with a switching TFT 112 of which a gate electrode is supplied with a scanning signal via the scanning line 101, a storage capacitor 113 for storing a pixel signal supplied from the signal line 102 via the switching TFT 112, a light-emitting element driving unit 18 of which a gate electrode is supplied with the pixel signal stored in the storage capacitor 113, an anode (electrode) 14 into which a driving current flows from the power line 103 when electrically connected to the power line 103 via the light-emitting element driving unit 18, and a light-emitting functional layer 82 interposed between the anode 14 and a cathode 17. In the light-emitting functional layer 82, the holes and the electrons to be injected from the anode 14 and the cathode 17 respectively are recombined, such that light-emitting phenomenon is generated.

According to the organic EL device 140, if the scanning line 101 is driven and the switching TFT 112 is turned on, the potential of the signal line 102 at that time is stored in the storage capacitor 113. In addition, depending on a state of the storage capacitance 113, an on or off state of the light-emitting element driving unit 18 is determined. And then, a current flows from the power line 103 into the anode 14 via a channel of the light-emitting element driving unit 18, and the current flows into the cathode 17 via the light-emitting functional layer 82. Then, the light-emitting functional layer 82 emits light depending on the amount of current flowing therethrough. Besides, since an on or off of light emission is controlled for every anode 14, the anode 14 functions as the pixel electrode.

Figure 9:
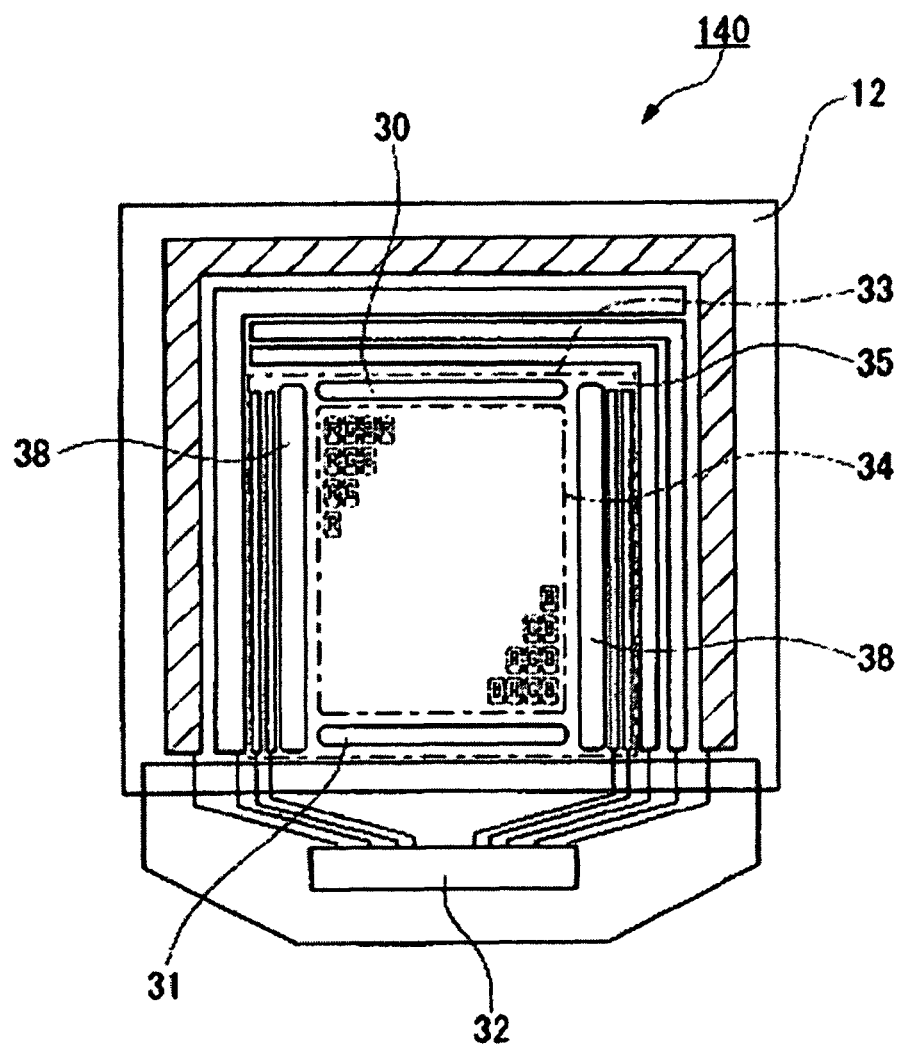
FIG. 9 is a plan view showing schematically the construction of the organic EL device according to the fifth embodiment of the present invention.
Figure 10:
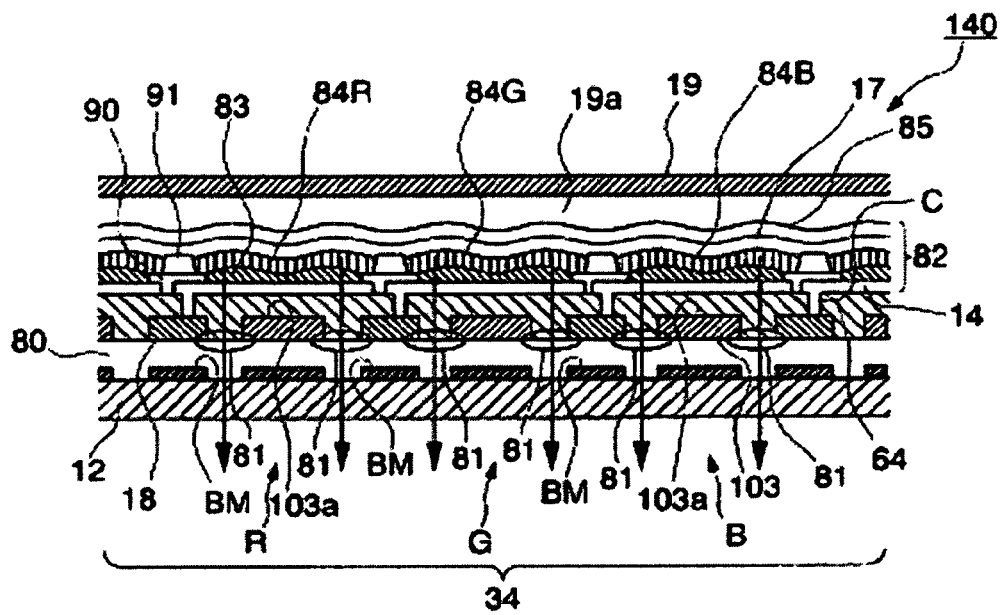
FIG. 10 is a side cross-sectional view of a display region of the organic EL device according to the fifth embodiment of the present invention.
Figure 11:
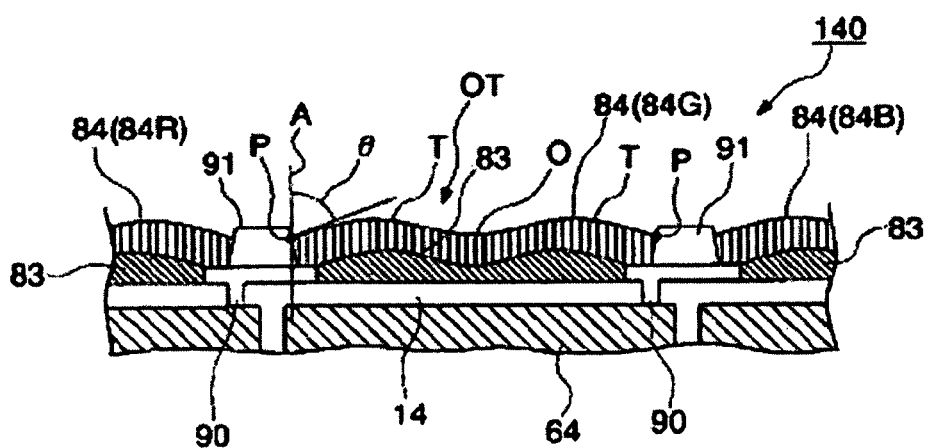
FIG. 11 is an expanded cross-sectional view of the vicinity of a light-emitting layer of the organic EL device according to the fifth embodiment of the present invention.
Figure 12:
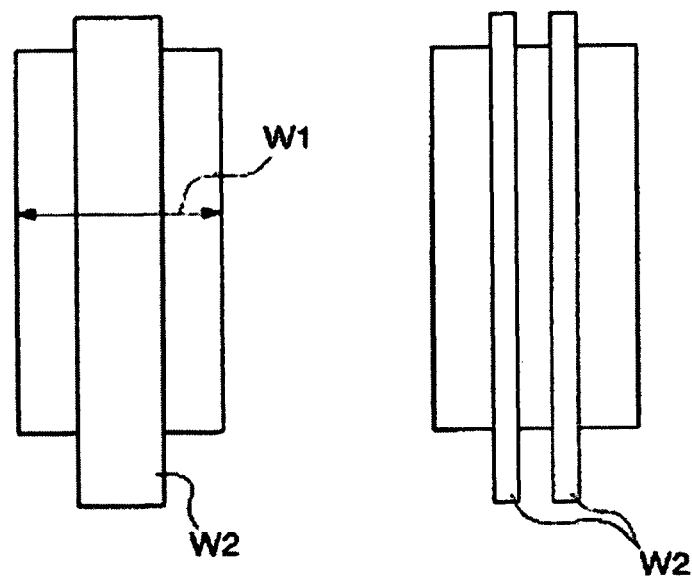
FIG. 12 is a diagram illustrating a comparison of a power supply line width and a pixel width in the organic EL device according to the fifth embodiment of the present invention.

Next, a specified aspect of the organic EL device 140 of the present embodiment will be described with reference to FIGS. 9 to 12. FIG. 9 is a plan view showing schematically the construction of the organic EL device 140, FIG. 10 is a side cross-sectional view of display regions R, G and B in FIG. 9, FIG. 11 is an expanded cross-sectional view of the vicinity of a light-emitting layer, and FIG. 12 is a diagram illustrating a comparison of a width of a power supply line and a width of a pixel.

As shown in FIG. 9, the organic EL device 140 of the present embodiment comprises the substrate 12 having electrical insulation, a pixel electrode region (not shown) in which the anodes 14 connected to the switching TFTs (not shown) are arranged in a matrix on the substrate, the power lines 103 arranged around the pixel electrode region and connected to the respective anodes 14 (see FIG. 8), a pixel portion 33 (in FIG. 9, within the one-dot chain line box) being positioned on at least the pixel electrode region and having substantially a rectangular shape in plan view, and the data line driving circuit 31. Moreover, the pixel portion 33 is divided into the actual display region 34 (in FIG. 9, within the two-dot chain line box) of a central portion and a dummy region 35 (the region between the one-dot chain line and the two-dot chain line) arranged in the vicinity of the actual display region 34.

In the actual display region 34, display regions R, G, and B respectively having the anode 14 are arranged so as to be separated from each other. Further, at both sides of the actual display region 34 in FIG. 9, the scanning line driving circuits 38 are arranged. The scanning line driving circuits 38 are provided to position below the dummy region 35.

Further, on an upper side of the actual display region 34 in FIG. 9, a test circuit 30 is arranged, and the test circuit 30 is provided on the lower side of the dummy region 35. The test circuit 30 is a circuit for testing operating conditions of the organic EL device 140. For example, the test circuit 30 comprises test information output means (not shown) that outputs test results to the outside. The test circuit 30 is constructed to test the quality and defects of an organic EL device during manufacture or at the time of shipment.

Driving voltages of the scanning line driving circuits 38 and the test circuit 30 are applied from a predetermined power supply unit via the power supply lines 103 (see FIG. 10) to the light-emitting element driving units 18. Further, driving control signals and driving voltages are transmitted and applied from a predetermined main driver or the like for controlling the operation of the organic EL device 140 to the scanning line driving circuits 38 and the test circuit 30. Moreover, in this case, the driving control signals are instruction signals from the main driver or the like relating to controls at the time when the scanning line driving circuits 38 and the test circuit 30 output signals.

As shown in FIG. 10, the organic EL device 140 is constructed by attaching the substrate 12 and the sealing substrate 19 via a sealing resin 19a. In a region surrounded by the substrate 12, the sealing substrate 19 and the sealing resin 19a, a drying agent is inserted, and simultaneously an inert gas filling layer in which an inert gas such as nitrogen gas is provided is formed.

In the case of the substrate-side-light-emission type (the bottom-emission-type) organic EL device, since the light is emitted from the substrate 12 side, the substrate 12 is made of a transparent or translucent material. For example, glass, quartz or resin (plastic, plastic film) is exemplified, and in particular, a low priced soda glass substrate is suitably used.

Further, in a base of the light-emitting element driving unit 18 or a base of the power supply line 103, a light shielding layer (light absorbing layer) BM made of, for example, a light absorbing material such as chromium oxide or titanium oxide is formed. Further, in the vicinity of the light shielding layer BM, a transparent insulating layer 80 is formed.

As the sealing substrate 19, for example, a plate-shaped member having electrical insulation can be adopted. Further, the sealing resin 19a is made of, for example, thermosetting resin or ultraviolet-curing resin. In particular, the sealing resin 9a is preferably made of epoxy resin which is a kind of thermosetting resin.

Further, on the substrate 12, the light-emitting element driving units 18 for driving the anode 14, the power supply lines 103, the interlayer insulating film 64 and the opening 81 are formed.

The light-emitting element driving units 18 . . . are switching elements formed by using a known TFT manufacturing technique, and it is a member in which an impurity-doped silicon film, a gate electrode, a gate insulating film and so on are deposited. In addition, the light-emitting element driving units 18 are provided corresponding to the display regions R, G and B, and, as described below, are respectively connected the anode 14.

The interlayer insulating film 64 is preferably made of a transparent resin material, and further, it is preferably made of a material having favorable workability. For example, the interlayer insulating film 64 is preferably made of thermosetting resin or ultraviolet-curing resin. In particular, it is preferable to adopt epoxy resin or acryl resin which is a kind of thermosetting resin. Further, in the interlayer insulating film 64, preferably, an interface to the anode 14 is smoothed. In order to smooth the interface, the interlayer insulating film 64 may be formed in a laminate through a plurality of processes. Further, in the interlayer insulating film 64, contact holes C are formed depending on positions of the light-emitting element driving units 18 and the anode 14, and the light-emitting element driving units 18 and the anode 14 are connected to each other by means of connecting wiring lines buried in the contact holes C.

Moreover, in various circuit portions which are covered with the interlayer insulating film 64, the scanning line driving circuits 38, the test circuit 30 and a driving voltage conducting portion and a driving control signal conducting portion for connecting and driving these circuits are included.

The power supply line 103 supplies the electric power to the light-emitting functional layer 101 depending on an on or off state of the light-emitting element driving unit 18, and it is preferably made of a metallic material having low resistance. For example, the power supply line 103 is made of an Al-based metallic material. Further, on the surfaces of the power supply lines 103, reflecting surfaces 103a are formed. Further, the reflecting surfaces 103a have light scattering property.

Further, as shown in FIG. 12, as regards the width W2 of the power supply line 103 and the pixel width W1, for example, when the pixel width W1 is 45 μm, the width W2 of the power supply line 103 is preferably 10 μm or less. Further, in the case in which the width W2 of the power supply line is needed to be large so as to plan low resistance of the power supply line 103, preferably, the power supply line 103 is plurally divided. For example, in the case in which a total width of the power supply lines 103 is set to 20 μm, the power supply line 103 is preferably divided into four lines each having a line width of 5 μm. Alternatively, in the case in which the pixel width W1 is set to 50 μm and the width W2 of the power supply line 103 is set to 10 μm, the number of the power supply lines is preferably two. Further, the power supply line 103 may have a plurally divided bamboo shape.

The openings 81 are formed adjacent between the light-emitting element driving units 18 and the power supply lines 103. The opening 81 is a portion through which emitted light from the light-emitting functional layer 82 passes to the actual display region (display region) 4 side. Further, an opening area of the opening 81 is determined depending on design items in consideration of the passing amount of emitted light, a planar area depending on resistance value of the power supply line 103, the arrangement of the light-emitting element driving unit 18, the multi-reflection reaction between the light-emitting functional layer 82 and the power supply line 103.

Further, the surface of the interlayer insulating film 64 on which the anodes 14 are formed is covered with the anodes 14, a lyophilic control layer 90 mainly containing a lyophilic material such as SiO$_2$, and bank layers (partitions) 91 made of acryl resin or polyimide resin. The bank layers 91 are arranged in a two-dimension to surround the respective anodes 14 between the anodes 14 and emitted light of the functional layers 110 is divided by the bank layers 91. Moreover, in the present embodiment, 'lyophilic property' of the lyophilic control layer means that the lyophilic control layer has lyophilic property higher than that of at least the material, such as acryl resin or polyimide resin, constituting the bank layer 91.

In addition, the light-emitting element driving unit 18 is connected to the respective anodes 14, and on an upper layer of the anodes 14, the light-emitting functional layer 82 is formed. Further, on an upper layer of the functional layer 82, the cathode 17 is formed.

The light-emitting functional layer 82 has a multi-layered structure interposed between the anode 14 and the cathode 17, and the hole injecting layer 83, the light-emitting layer 84 (84R, 84G and 84B) are sequentially formed from the anode 14 side.

The anode 14 is made of ITO and injects holes toward the light-emitting layer 84 by an applied voltage. The anode 14 has a high work function and conductance. The material for the anode 14 is not limited to ITO. In the case of sealing-side-light-emission type organic EL device, in particular, it is not necessary to adopt a transmissive material, and thus a suitable material may be used. Further, in the case of the substrate-side-light-emission-type organic EL device, it is possible to adopt a known transmissive material. For example, metallic oxide is exemplified. That is, indium tin oxide (ITO) or a material in which zinc (Zn) is contained in metallic oxide, for example, indium oxide/zinc oxide-based amorphous transparent conductive film (indium zinc oxide: IZO) (Registered Trademark) (manufactured by Idemitsu Kosan Co., Ltd.) may be adopted.

The hole injecting layer 83 is one of conductive high molecular materials and is intended to inject holes of the anode 14 into the light-emitting layer 84. The hole injecting layer 83 is formed to have a film thickness of 30 nm. As an example of a material for the hole injecting layer, various conductive high molecular materials are suitably used. For example, PEDOT:PSS, polythiophene, polyaniline, polypyrrole or the like may be adopted.

The light-emitting layer 84 generates fluorescence by means of recombination of holes injected from the anode 14 via the hole injecting layer 83 and electrons injected from the cathode 17. As a material for the light-emitting layer 84, known light-emitting materials which can emit fluorescence or phosphorescence may be used. More specifically, polyfluorene derivative (PF), (poly)paraphenylenevinylene derivative (PPV), polyphenylene derivative (PP), polyparaphenylene derivative (PPP), polyvinylcarbazole derivative (PVK), polythiophene derivative, polysilane system such as polymethylphenylsilane (PMPS) or the like is suitably used. Further, the light-emitting layer may also be made of materials in which, into these high molecular materials, high molecular materials, such as perylene-based pigment, coumarin-based pigment, or rhodamine-based pigment, or low molecular materials, such as rubrene, perylene, 9,10-diphenylanthracene, tetraphenylbutadiene, Nile red, coumarin 6 or quinacridone are doped.

Further, the organic EL device 140 of the present embodiment is constructed to perform color display. That is, the respective light-emitting layers 84 are formed so as to correspond to three primary colors in the display regions R, G and B corresponding to three primary colors R, G and B of light, such that the light-emitting layers 84R, 84G and 84B are constructed.

Next, the cross-sectional shape of the light-emitting layer 84 will be described with reference to FIG. 11.

As shown in FIG. 11, the light-emitting layer 84 has an uneven surface OT comprising a concave portion T (top portion) and a convex portion O (bottom portion) on its upper portion, and in an end portion of the concave portion T, a contact point (end portion) P which contacts the bank layer 91 is provided. In the contact point P, an angle θ which a perpendicular A extending in a vertical direction of the substrate 12 and the uneven surface OT make is set in the range of 30° to 50°. Determination of the angle is performed by adjusting the liquid repellency of the surface of the bank layer 91 to the liquid material of the light-emitting layer 84. Therefore, the angle θ is suitably set. In addition, the concave portion T is formed at a position corresponding to the opening 81.

As shown in FIG. 10, the cathode 17 has an area wider than a total area of the actual display region 34 and the dummy region 35, to thereby cover both of them. The cathode 17 is a counter electrode of the anode 14 and has a function of injecting electrons into the light-emitting layer 84. As a material for the cathode 17, for example, a laminate of a first cathode layer formed by depositing calcium metallic material or an alloy mainly containing calcium on the light-emitting layer 84 and a second cathode layer formed by depositing aluminum, an alloy mainly containing aluminum, silver, silver-magnesium alloy or the like on the first cathode layer may be adopted. Moreover, the second cathode layer is provided to cover the first cathode layer so as to protect from a chemical reaction with such as oxygen or moisture and so as to increase conductance of the cathode 17. Therefore, the cathode 17 has chemical stability and a low work function. Further, the cathode 17 may be formed in a single-layered structure. Moreover, the material for the cathode 17 is not limited to the metallic material.

Further, the cathode 17 has a reflecting surface at the light-emitting layer 84 side, to thereby reflect emitted light of the light-emitting layer 84 to the actual display region 34 side. Moreover, the cathode 17 itself may be made of a reflective material.

Further, since the reflecting surface of the cathode 17 has a curved surface formed depending on the uneven surface OT of the light-emitting layer 84, for example, the reflecting surface formed in the concave portion T of the light-emitting layer 84 functions as a mirror for condensing emitted light toward the actual display region 34.

In the organic EL device 140 having such the construction, if a driving current from the power supply line (see FIG. 8) flows into the anode 14 of the light-emitting functional layer 82, a potential difference between the anode 14 and the cathode 17 is generated. And then, holes of the anode 14 are injected into the light-emitting layer 84 via the hole injecting layer 83, and electrons of the cathode 17 are injected into the light-emitting layer 84. Thus, the holes and electrons injected into the light-emitting layer 84 are recombined, such that the light-emitting layer 84 emits. And then, emitted light of the light-emitting layer 84 may be directly emitted to the actual display region 34 via the opening 81 or the emitted light may collide against the power supply lines 103. Here, since in the power supply line 103, the reflecting surface 103a is formed, the emitted light is reflected by the reflecting surface 103a of the power supply line 103 or the reflecting surface of the cathode 17 to be emitted from the opening 81. Also, the emitted light propagates in a horizontal direction of the light-emitting layer 84 by means of multi-reflection in the reflecting surface 103a and the cathode 17 and then is emitted from the opening 81. Further, since the reflecting surface 103a has light scattering property, the emitted light colliding against the reflecting surface 103a is scattered, and thus attenuation of the emitted light due to the multi-reflection is suppressed. Further, since the cathode 17 is formed depending on the uneven surface OT of the light-emitting layer 84, the cathode 17 has the curved-shaped reflecting surface. Further, since the concave portion T depends on the position of the opening 81, the reflecting surface of the cathode 17 is formed at a position depending on the opening 81. Therefore, the emitted light reflected by the reflecting surface of the cathode 17 is condensed, and thus the emitted light is emitted from the opening 81 with having strong intensity.

As described above, in the organic EL device 140 of the present embodiment, the power supply lines 103 which are arranged to block the actual display region 34 are provided, and the power supply lines 103 have the reflecting surfaces 103a respectively. Further, in the side portions of the power supply lines 103, the openings 81 are formed. Thus, even when the power supply lines 103 are formed so as to block the actual display region 34, the emitted light is reflected and emitted from the openings 81, such that it is possible to improve the emission efficiency of light. Further, when the organic EL device 140 having the large screen is implemented, a line width of the power supply line 103 becomes large to reduce the resistance of the wiring line, and then the actual display region 34 is shielded, which results in decreasing the emission efficiency of light. However, in the present embodiment, by adopting the above-mentioned construction, it is possible to suppress the emission efficiency of light decreasing. Therefore, a degree of freedom for a wiring structure or a wiring pattern increases, and thus it is possible to allow the light-emitting element driving units 18, various wiring lines of the switching TFT 112 or the power supply lines 103 to be spread in desired positions. As a result, it is possible to easily implement the large screen.

Further, since the emitted light is emitted from the opening 81, for example, by forming the power supply lines 103 in a desired pattern, it is possible to allow the emitted light to be emitted from a desired opening 81. Further, in the case in which an intensity of emitted light is biased due to the shape of the light-emitting layer 84 or the cathode 17, a pattern of the power supply lines 103 is positively adjusted and the opening 81 is formed at a desired position, such that the light is efficiently emitted. Thus, it is possible to further improve the emission efficiency of light. And then, the above-mentioned construction is effective, in particular, in the case of the so-called bottom-emission structure in which the light is emitted from the substrate 12 side, on which the light-emitting element driving units 18 or various wiring lines are formed.

Further, the power supply lines 103 may be plurally branched off.

In such a manner, if the power supply lines 103 are plurally branched off, the opening 81 is plurally formed. Thus, it is possible to allow emitted light to be emitted from the opening 81. Here, if the power supply lines 103 are branched off in a desired pattern, it is possible to allow emitted light to be emitted from the desired opening 81. Further, in the case in which the intensity of emitted light is biased due to the shape of the light-emitting layer 84 or the cathode 17, the power supply lines 103 are positively branched off, and the opening 81 is formed in a desired position, such that the emitted light is efficiently emitted. Thus, it is possible to further improve the emission efficiency of light. Further, since multi-reflection can be avoided, it is possible to suppress attenuation of emitted light due to the multi-reflection.

Further, since the reflecting surface 103a has light scattering property for scattering emitted light, it is possible to scatter emitted light colliding against the reflecting surface 103a. Therefore, it is possible to prevent emitted light from being biased in a reflecting direction. Further, if the reflecting surface 103a has light scattering property not to reflect the emitted light toward the light-emitting layer 84, multi-reflection can be avoided, such that it is possible to suppress attenuation of emitted light due to the multi-reflection.

Further, since the cathode 17 is reflective, it is possible to allow the light emitted from the light-emitting layer 84 toward the cathode 17 or the emitted light reflected by the power supply lines 103 to be reflected toward the power supply lines 103 or the openings 81.

Further, since the light-emitting layer 84 has the uneven surface OT, it is possible to allow emitted light to be emitted depending on the shape of the uneven surface OT. Further, since the cathode 17 being reflective is formed so as to cover the uneven surface OT, it is possible to allow emitted light to be emitted in a normal direction of the uneven surface OT. And then, the concave portion T or the convex portion O in the uneven surface OT corresponds to the opening 81, it is possible to allow emitted light to be reflected toward the opening 81.

Further, if the uneven surface OT is formed in a desired shape, it becomes possible to condense emitted light at a desired position, and further it is possible to strengthen partially a light-emitting intensity. Further, by allowing emitted light to be directly emitted from the opening 81 or by allowing emitted light to be reflected by an arbitrary portion and to be emitted, it is possible to further improve the emission efficiency of light.

Further, in the contact point P at which the uneven surface OT of the light-emitting layer 84 and the bank layer 91 contact with each other, since a value of the angle θ is in the range of 30° to 50°, it is possible to further promote the above advantages.

Further, since the light shielding layer BM is formed, the reflection of external light from a viewer side who views the actual display region 34 is prevented, and thus it is possible to advance contrast.

Moreover, in the above construction, the anodes 14 are constructed by the transparent conductive film made of ITO, but the anodes 14 may be formed with a reflective conductive material and a slit may be formed at a position corresponding to the opening 81 of the reflective conductive material.

According to this construction, after reflection is repeated between the anode 14 and the cathode 17, the emitted light can be emitted from the slit portion.

Further, in the above construction, the electron injecting/transporting layer may be provided between the light-emitting layer 84 and the cathode 17. Here, the electron injecting/transporting layer preferably has a film thickness so as to have the transmitting property. If doing so, it is possible to prevent the light-emitting intensity from being lowered, without shielding emitted light reflected by the cathode 17. The electron injecting/transporting layer serves to inject electrons into the light-emitting layer 84. A material for the electron injecting/transporting layer is not particularly limited, and, for example, oxadiazole derivative, anthraquinodimethane and its derivative, benzoquinone and its derivative, naphthoquinone and its derivative, anthraquinone and its derivative, tetracyanoanthraquinodimethane and its derivative, fluorenone derivative, diphenyldicyanoethylene and its derivative, diphenoquinone derivative, 8-hydroxyquinoline and metal complex of its derivative may be used. More specifically, similarly to the above-mentioned material for the hole transporting layer, materials described in Japanese Unexamined Patent Application Publication Nos. S63-70257, S63-175860, H2-135359, H2-135361, H2-209988, H3-37992 and H3-152184 may be exemplified. In particular, 2-(4-biphenylyl)-5-(4-t-butylphenyl)-1,3,4,-oxadiazole, benzoquinone, anthraquinone, or tris(8-quinolinol)aluminum is suitably used.

(Manufacturing Method of Organic EL Device)

Next, a manufacturing method of the above-mentioned organic EL device 140 will be described with reference to FIG. 10.

First, chromium oxide film or titanium oxide film is formed as the light shielding layer BM on the substrate 12 and patterned such that the light-emitting potion is selected. Next, if necessary, the insulating film 80 is formed with $SiO_2$ or the like, and the scanning line 101, the signal line 102, the power supply line 103, the storage capacitor 103, the switching TFT 112 and the light-emitting element driving unit 18 are formed on the insulating film 80. Further, in the vicinities of the end portions of the respective wiring lines, the data line driving circuit 31 and the scanning line driving circuit 38 are formed. And then, a distance between the light-emitting element driving unit 18 and the power supply line 103 is left to be opened, if possible. In the present embodiment, the distance is set to 10 μm.

Next, the interlayer insulating film 64 is formed. The film thickness of the interlayer insulating film 64 is preferably 100 nm or more. If the film thickness is not sufficient, there may be a case in which a wavelength of emitted light changes and thus a desired light-emitting color can not be realized. Here, in order to surely display the respective colors of RGB, it is preferable to form the interlayer insulating film 64 to have a sufficient film thickness. Further, by adjusting the film thickness of the interlayer insulating film 64, it is possible to suitably adjust the distance from the light-emitting layer 84 up to the reflecting surface 103a of the power supply line 103, and a light-emitting wavelength. That is, it is preferable to determine the film thickness of the interlayer insulating film 64 in consideration of the wavelength region. Further, the film thickness of the interlayer insulating film 64 is adjusted depending on the refractive index of a transmissive material through which emitted light transmits. Further, the upper surface of the interlayer insulating film 64 is preferably smoothed. To this end, the interlayer insulating film 64 may be formed through a plurality of processes.

Next, ITO is formed on the interlayer insulating film 64 and patterned to form the anodes 14.

Here, preferably, in the interlayer insulating film 64, the contact holes C are previously formed. In such a manner, by forming the anodes 14, the drain electrodes of the light-emitting element driving units 18 and the anodes 14 are connected to each other respectively. Moreover, the anodes 14 may be formed by ejecting an ink material in desired positions using a printing method or the ink jet method and by drying the ink material.

Next, by film-forming $SiO_2$ as an inorganic insulating material to determine the pixel opening and then patterning, the lyophilic control layer 90 is formed.

Next, by film-forming a resin material on the lyophilic control layer 90 and patterning, the bank layer 91 is formed (a step of forming the partition). Here, the film thickness of the bank layer 91 is set to 50 nm. More specifically, after forming an organic material by coating a material, in which resist such as acryl resin or polyimide resin is solved in a solvent, using various coating methods such as a spin coat method and a deep coat method, patterning is performed using etching. However, in the case in which the ink material is ejected and dried by the printing method or the ink jet method (material ejection method), it is not necessary for the patterning step, and thus the material is not wasted. As a result, it is more preferable. Here, if the film thickness of the bank layer 91 is 100 nm or more, a profile of an organic layer in the pixel after drying is smoothed, emitting efficiency is lowered. Thus, preferably, the film thickness is 50 nm or less, if possible. In addition, as regards a thin liquid-repellent film, instead of the bank layer 91, after a liquid-repellent treatment may be performed, VUV (ultraviolet rays having a wavelength of 300 nm or less) may be irradiated only to the pixel opening. As a liquid-repellent treatment agent, fluorine alkyl-attached titanium coupling agent or silane coupling agent may be used.

In the case in which the power supply line is subdivided in a bamboo shape and emitted light is emitted from gaps, the film thickness of the bank layer 91 is not limited to the above value. In order to reduce parasitic capacitance between the TFT or the wiring line and the cathode to a negligible extent, the film thickness of the bank layer 91 is preferably about 1 to 2 μm.

Next, after oxygen plasma is irradiated to the entire surface as a lyophilic treatment, in order to allow only the surface of the bank layer 91 to have liquid-repellency, CF4 plasma is irradiated.

Next, by using the ink jet method (liquid droplet ejection method), the hole injecting layer 83 and the light-emitting layer 84 are formed (a step of forming the light-emitting layer adjacent to the partition). That is, as a hole injecting material, PEDOT:PSS ink is ejected adjacent to the bank layer 91, dried, and fired at 200° C., such that the hole injecting layer 83 is formed. In addition, as the light-emitting layer 84, materials which emit red, green and blue are sequentially ejected adjacent to the bank layer 91, such that three primary colors are formed.

Next, the reflective cathode 17 is formed using the vapor deposition, and additionally a passivation film 85 is formed.

In addition, by filling the drying agent (not shown), and by adhering the sealing substrate 19, the organic EL device 140 is completed.

As described above, in the manufacturing method of the organic EL device 140 of the present embodiment, it is possible to obtain the same advantages as those in the above-mentioned organic EL device 140.

Further, the manufacturing method has the step of forming the bank layer 91 and the step of forming the light-emitting layer 84 adjacent to the bank layer 91 using the ink jet method. Thus, in the contact point P of the bank layer 91 and the light-emitting layer 84, it is possible to allow the bank layer 91 and the light-emitting layer 84 to contact each other at a desired angle due to various causes such as liquid-repellency of the bank layer 91, lyophilic property of the base, or evaporation characteristics of a solvent of the material for the light-emitting layer 84. Therefore, it is possible to easily form the above-mentioned uneven surface OT.

Sixth Embodiment of Light-Emitting Device

Next, a sixth embodiment of a light-emitting device of the present invention will be described with reference to FIG. 13.

Moreover, in the present embodiment, the same elements as those of the fifth embodiment are represented by the same reference numerals, and the description on the same elements will be omitted.

Figure 13:
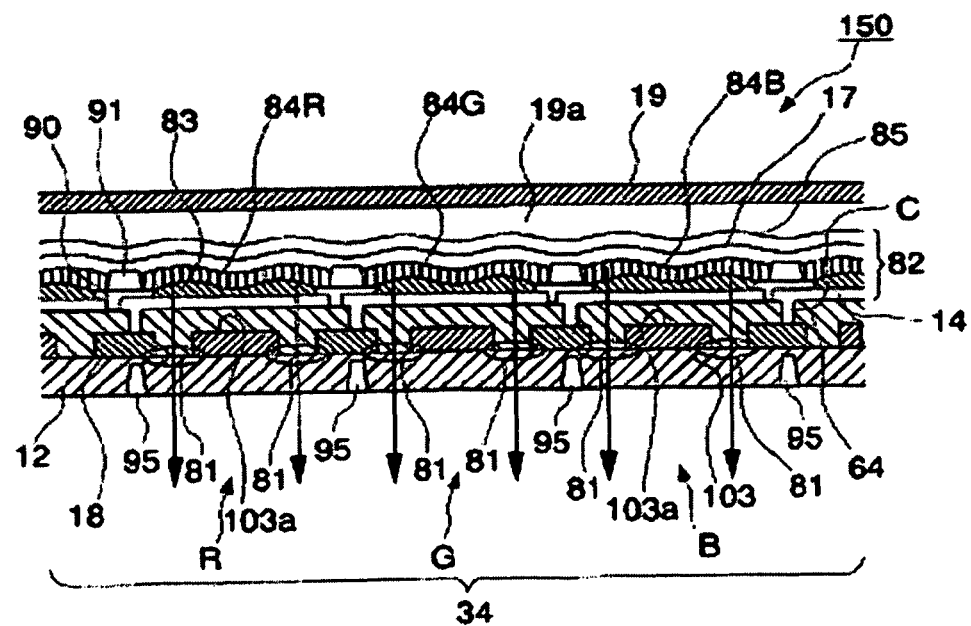
FIG. 13 is a side cross-sectional view of a display region of an organic EL device according to a sixth embodiment of the present invention.

As shown in FIG. 13, an organic EL device (light-emitting device) 150 has the construction in which a reflecting portion 95 is formed at the actual display region 34 side of the substrate 12.

In such a manner, by providing the reflecting portion 95 in the substrate 12, it is possible to allow emitted light from the opening 81 to be surely emitted to the viewer side. Therefore, it is possible to further promote the above advantages.

As described in the above mentioned fifth and sixth embodiments, it is possible to realize the bottom-emission-type structure in which reliability is secured by using a practical electrode and power lines can be spread in the pixel. Further, according to this construction, among emitted light components in the light-emitting layer 84, light components propagating in a plane (a horizontal direction of the substrate 12) can be emitted outside. Thus, it is possible to realize the emission efficiency of 80 percent or more. Further, since the pixel opening can be small and a light absorbing treatment is performed except for the pixel opening, it is possible to advance contrast without using a polarizing plate.

Moreover, in the organic EL devices 100, 110, 120, 130, 140 and 150 of the first to sixth embodiments, in order to improve the emission efficiency of light, optical components such as a lens or the like may be provided.

Further, in the first to sixth embodiments, the organic EL device as the light-emitting device is described, but the present invention is not limited to the organic EL device. Other than the organic EL device, the present invention may be applied to devices using plasma light emission or fluorescence by means of electron emission (for example, PDP, FED, SED).

(Electronic Apparatus)

Hereinafter, an example of an electronic apparatus comprising the organic EL device of the above-mentioned embodiment will be described.

Figure 14A:
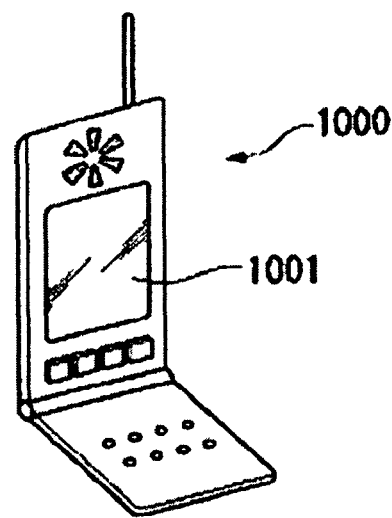
FIG. 14 is a diagram showing an electronic apparatus comprising an organic EL device of the present invention.

FIG. 14A is a perspective view showing an example of a cellular phone. In FIG. 14A, the reference numeral 1000 denotes a main body of the cellular phone, and the reference numeral 1001 denotes a display unit using the above-mentioned organic EL device.

Figure 14B:
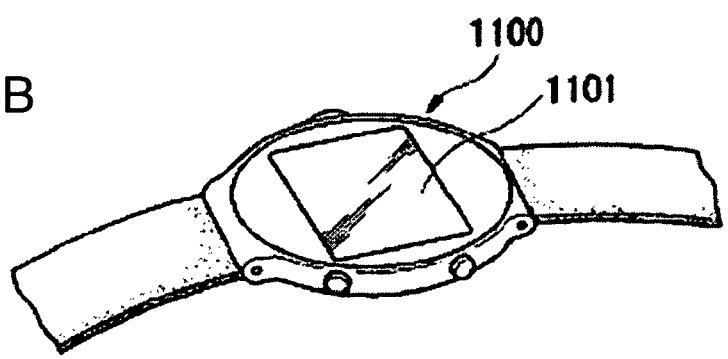

FIG. 14B is a perspective view showing an example of a wrist watch type electronic apparatus. In FIG. 14B, the reference numeral 1100 denotes a main body of the watch, and the reference numeral 1101 denotes a display unit using the above-mentioned organic EL device.

Figure 14C:
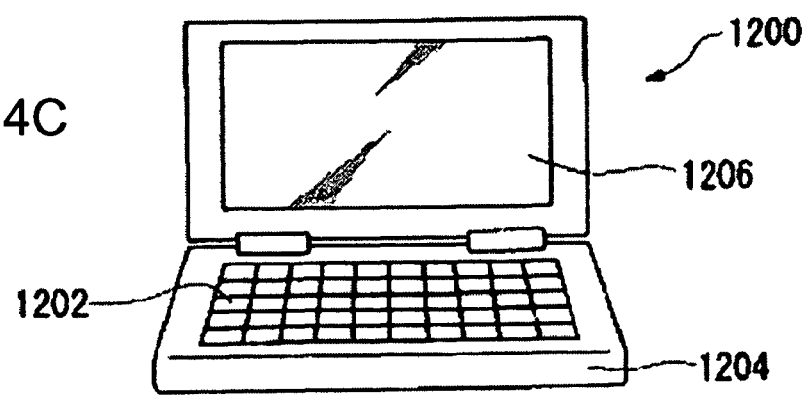

FIG. 14C is a perspective view showing an example of a portable information processing device such as a word processor or a personal computer. In FIG. 14C, the reference numeral 1200 denotes an information processing device, the reference numeral 1202 denotes an input unit such as a keyboard, the reference numeral 1204 denotes a main body of the information processing device, and the reference numeral 1206 denotes a display unit using the above-mentioned organic EL device.

The electronic apparatuses shown in FIGS. 14A to 14C respectively comprise the organic EL devices of the above-mentioned embodiments. Thus, the respective electronic apparatuses comprise the display unit which can display images with high brightness and high contrast.

Moreover, as an electronic apparatus, the present invention is not limited to the above-mentioned cellular phone, but it can be applied to various electronic apparatuses. For example, the present invention can be applied to an electronic apparatus, such as a notebook computer, a liquid crystal projector, a multimedia personal computer (PC) and an engineering workstation (EWS), a pager, a word processor, a television, a view finder type or monitor-direct-view type video tape recorder, an electronic organizer, an electronic calculator, a car navigation device, a POS terminal, and a device comprising a touch panel, as a display unit.

Further, in the electronic apparatus of the present invention, it is possible to reduce brightness irregularity of the light-emitting element. Thus, the present invention can be used suitably in an electronic apparatus comprising a large display unit of 20-inch diagonal or more.

What is claimed is:

1. A light-emitting device comprising:
   a substrate;
   a first electrode being reflective over the substrate;
   a functional layer having a light-emitting layer on the first electrode;
   a second electrode having a first conductive film and a second conductive film, the first conductive film being transparent and being contacted with the functional layer, the second conductive film being reflective and having higher conductance than the first conductive film, and being contacted with a part of the first conductive film at an area where the first electrode is located in planar view;
   a light-emitting element including the first electrode, the functional layer and the second electrode; and
   a partition that surrounds the light-emitting element, the first electrode extending to an inner wall surface of the partition, and the partition having a plurality of layers, at least one of the layers from the plurality of layers being reflective.

2. The light-emitting device according to claim 1, the second conductive film being formed by a plurality of separated patterns.

3. An electronic apparatus comprising a light-emitting device according to claim 1.

* * * * *